US 6,734,428 B2

(12) United States Patent
Parker et al.

(10) Patent No.: US 6,734,428 B2
(45) Date of Patent: May 11, 2004

(54) MULTI-BEAM MULTI-COLUMN ELECTRON BEAM INSPECTION SYSTEM

(75) Inventors: N. William Parker, Santa Clara, CA (US); S. Daniel Miller, Gilroy, CA (US)

(73) Assignee: Multibeam Systems, Inc., Santa Clara, CA (US)

( * ) Notice: Subject to any disclaimer, the term of this patent is extended or adjusted under 35 U.S.C. 154(b) by 0 days.

(21) Appl. No.: 10/222,759

(22) Filed: Aug. 15, 2002

(65) Prior Publication Data

US 2003/0066963 A1 Apr. 10, 2003

Related U.S. Application Data

(63) Continuation-in-part of application No. 09/789,180, filed on Feb. 19, 2001.
(60) Provisional application No. 60/183,724, filed on Feb. 19, 2000.

(51) Int. Cl.[7] ............................ G01N 23/00; G21K 7/00
(52) U.S. Cl. ....................................................... 250/310
(58) Field of Search ................................ 250/310, 397, 250/492.2, 491.1, 499.22; 430/296

(56) References Cited

U.S. PATENT DOCUMENTS

| | | | |
|---|---|---|---|
| 4,390,789 A | 6/1983 | Smith et al. | 250/492.2 |
| 4,430,571 A | 2/1984 | Smith et al. | 250/492.2 |
| 4,661,709 A | 4/1987 | Walker et al. | 250/396 R |
| 4,694,178 A | 9/1987 | Harte | 250/396 R |
| 4,742,234 A | 5/1988 | Feldman et al. | 250/492.2 |
| 4,902,898 A | 2/1990 | Jones et al. | 250/492.2 |
| 5,363,021 A | 11/1994 | MacDonald | 315/366 |
| 5,384,463 A | 1/1995 | Honjo et al. | 250/398 |
| 5,430,292 A | 7/1995 | Honjo et al. | 250/310 |
| 5,502,306 A * | 3/1996 | Meisburger et al. | 250/310 |
| 5,557,105 A | 9/1996 | Honjo et al. | 250/310 |
| 5,578,821 A | 11/1996 | Meisburger et al. | 250/310 |
| 5,661,307 A | 8/1997 | Tanaka et al. | 250/492.2 |
| 5,892,224 A | 4/1999 | Nakasuji | 250/310 |
| 5,981,962 A | 11/1999 | Groves et al. | 250/492.23 |
| 6,023,060 A | 2/2000 | Chang et al. | 250/310 |
| 6,157,039 A | 12/2000 | Mankos | 250/492.2 |
| 6,252,412 B1 * | 6/2001 | Talbot et al. | 324/750 |
| 6,465,783 B1 * | 10/2002 | Nakasuji | 250/311 |
| 6,509,750 B1 * | 1/2003 | Talbot et al. | 324/750 |
| 2001/0032939 A1 | 10/2001 | Gerlach et al. | 250/492.3 |
| 2002/0015143 A1 * | 2/2002 | Yin et al. | 355/133 |
| 2002/0117967 A1 | 8/2002 | Gerlach et al. | 315/13.1 |

* cited by examiner

Primary Examiner—Jack Berman
Assistant Examiner—Johnnie L Smith, II
(74) Attorney, Agent, or Firm—David Jaffer; Pillsbury Winthrop LLP

(57) ABSTRACT

An electron optics assembly for a multi-column electron beam inspection tool comprises a single accelerator structure and a single focus electrode mounting plate for all columns; the other electron optical components are one per column and are independently alignable. The accelerator structure comprises first and final accelerator electrodes with a set of accelerator plates in between; the first and final accelerator plates have an aperture for each column and the accelerator plates have a single aperture such that the electron optical axes for all columns pass through the single aperture. Independently alignable focus electrodes are attached to the focus electrode mounting plate, allowing each electrode to be aligned to the electron optical axis of its corresponding column. There is one electron gun per column, mounted on the top of the single accelerator structure. In other embodiments, the electron guns are mounted to a single gun mounting plate positioned above the accelerator structure.

19 Claims, 17 Drawing Sheets

MULTI-BEAM MULTI-COLUMN ELECTRON BEAM INSPECTION SYSTEM

CROSS-REFERENCE TO RELATED APPLICATIONS

This application is a continuation-in-part of U.S. application Ser. No. 09/789,180 filed Feb. 19, 2001, which in turn claims the benefit of U.S. Provisional Application No. 60/183,724 filed Feb. 19, 2000.

BACKGROUND OF THE INVENTION

1. Field of the Invention

This invention relates to the field of wafer defect inspection, and in particular to electron optical structures used for wafer inspection.

2. Description of the Related Art

Defect inspection of semiconductor wafers and masks for IC manufacturing is an accepted production process for yield enhancement. The information obtained from a wafer defect inspection tool can be used to flag defective wafers for reprocessing, or to correct wafer processing parameters. The systems used for inspection typically use light optics and such systems are limited in resolution due to the wavelength of the measuring light (200–400 nm). As the feature sizes on semiconductor wafers drop below 0.18 $\mu$m, the resolution requirements of the defect inspection tools become more demanding.

To overcome this resolution limit, electron beam inspection systems have been designed. Electron beam systems can have much higher resolution than optical systems because the wavelength of the electrons can be in the Angstrom regime. Electron beam systems are limited in the speed at which they can inspect wafers—in present systems, throughputs of approximately 30 minutes per square cm have been reported (Hendricks et al, SPIE vol. 2439, pg. 174). Thus to inspect an entire 300 mm diameter silicon wafer, approximately 70 hours would be required. These systems can be used in a sampling mode where only a small percent of the wafer area is inspected, thereby increasing throughput substantially. These systems have been effective for research and product development, but are impractical for use in-line in a semiconductor fabrication facility.

Multi-beam electron beam inspection tools have been proposed. These tools have electron optical designs that vary from multiple electron beam columns built on a single semiconductor wafer to a number of physically separate electron beam columns clustered together. Multiple columns built on a single wafer must be "perfect" columns as-fabricated, since there is no facility for adjusting the physical electron optical alignment of any column; further, the electron optical components of the column are restricted to what can be fabricated on a semiconductor wafer. The cluster of physically separate electron beam columns is costly to manufacture. Clearly, there is a need for an electron optical design that provides more flexibility in the choice of electron optical components than the single wafer design, combined with the ability to independently align electron optical components for each column, and there is a need for a design with a lower manufacturing cost than the cluster of physically separate columns.

SUMMARY OF THE INVENTION

An electron optics assembly for a multi-column electron beam inspection tool comprises one or more electron optical components which are single structures for the assembly, all other electron optical components are one per column and are independently alignable to the electron optical axes of their corresponding columns. Examples of electron optical components which can be single structures are the first accelerator electrode, the final accelerator electrode, the focus electrode mounting plate and the gun mounting plate. These single structures can provide mechanical integrity to the electron optics assembly and facilitate the manufacture of the assembly.

In a preferred embodiment, an electron optics assembly for a multi-column electron beam inspection tool comprises a single accelerator structure and a single focus electrode mounting plate for all columns; the other electron optical components are one per column and are independently alignable. The accelerator structure comprises first and final accelerator electrodes with a set of accelerator plates in between; the first and final accelerator plates have an aperture for each column and the accelerator plates have a single aperture such that the electron optical axes for all columns pass through the single aperture. Independently alignable focus electrodes are attached to the focus electrode mounting plate, allowing each electrode to be aligned to the electron optical axis of its corresponding column. There is one electron gun per column, mounted on the top of the single accelerator structure. In other embodiments, the electron guns are mounted to a single gun mounting plate positioned above the accelerator structure. The electron optics assembly can further comprise independently alignable, one per column, scanning deflectors, second focus electrodes, electron detectors, field-free tubes and voltage contrast plates coupled to the focus electrode mounting plate and independently alignable, one per column, alignment deflectors coupled to the first accelerator electrode. In preferred embodiments, the electron emitters are Schottky emitters. The columns within the electron optics assembly can be arranged in an array, in a single row or in multiple rows.

BRIEF DESCRIPTION OF THE FIGURES

FIGS. 6a, 6b, 6c, 6d, 6e, 6f, 6g, 6h, 6i, 6j, 6k, and 6l show schematic cross-sectional representations of the electron optics assembly, illustrating steps in the assembly according to the invention.

DETAILED DESCRIPTION

The invention disclosed herein is a multiple column electron optical assembly, each column having an electron gun, for a high resolution electron beam substrate defect inspection tool. The multiple columns allow for high throughput substrate inspection. Certain embodiments of this invention are designed for the detection of defects for features with critical dimensions (CDs) in the range 25 nm–100 nm, with a substrate throughput suitable for in-line use in a semiconductor fabrication facility.

Figure 1B:
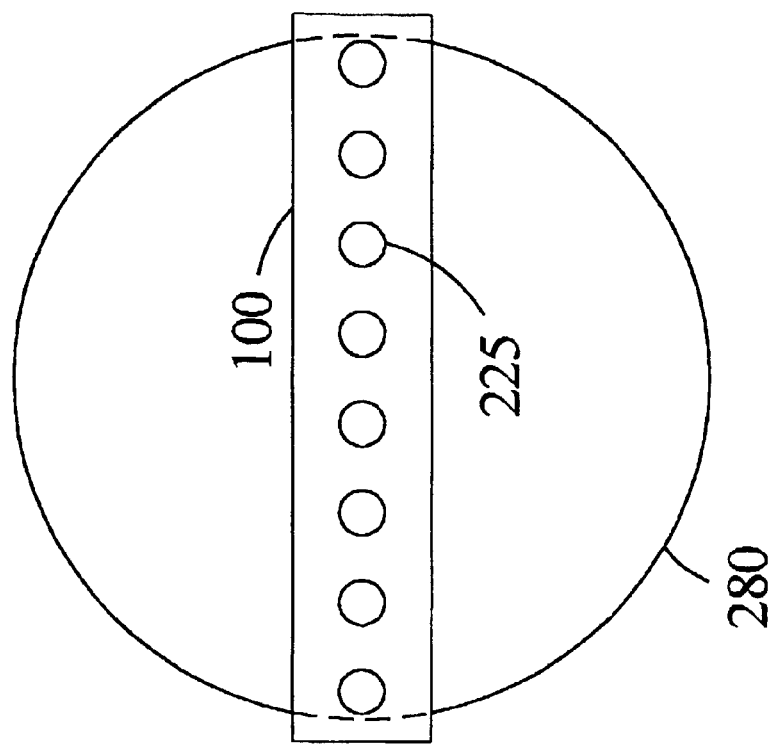
FIG. 1b shows a schematic top plan view of a multi-column assembly over a wafer; the assembly is shown configured with a single row of electron guns.
Figure 1A:
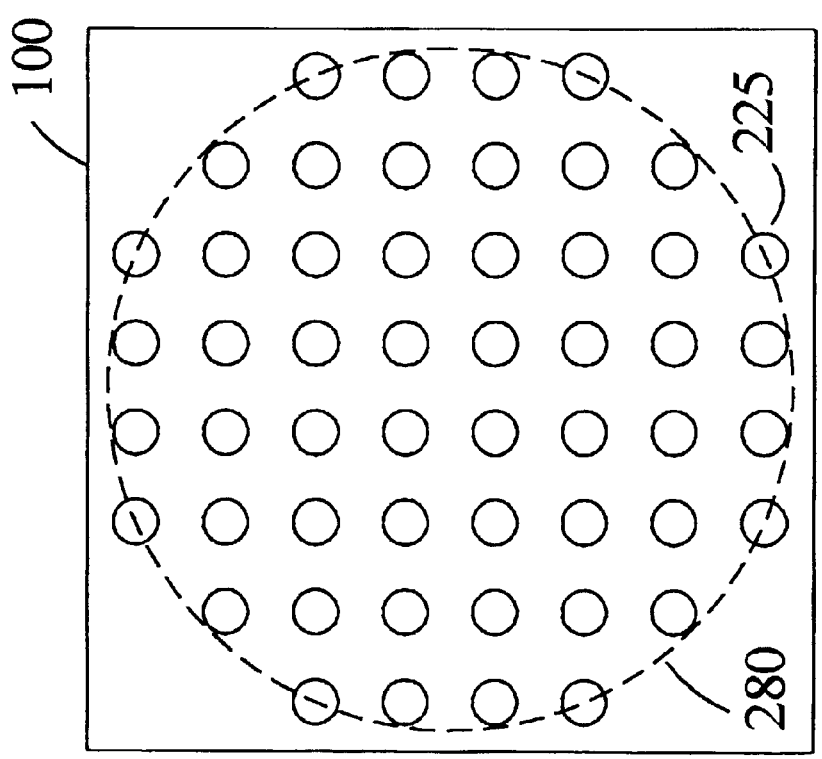
FIG. 1a shows a schematic top plan view of a multi-column assembly over a wafer; the assembly is shown configured with an array of electron guns.

FIG. 1a shows a schematic top plan view of an electron optics assembly 100 which contains multiple electron optical columns, an electron gun 225 sits on the top of each column. A substrate 280, such as a semiconductor wafer, is situated below the electron optics assembly 100. An arrangement of columns in an array, where each column sits below an electron gun 225, is shown in FIG. 1a. An alternative arrangement is shown in FIG. 1b, where the electron guns 225, and hence the columns, are arranged in a row and the electron optics assembly 100 is sized accordingly. Many different arrangements of columns may be desired depending on the substrate and the inspection method; for example, the columns can be arranged on cubic, rectangular, triangular or hexagonal lattices and the electron optics assembly 100 can comprise a single row or multiple rows of electron optical columns. The column footprint may typically be any size in between 10×10 mm and 40×40 mm (and may include footprints that are not square).

Figure 2:
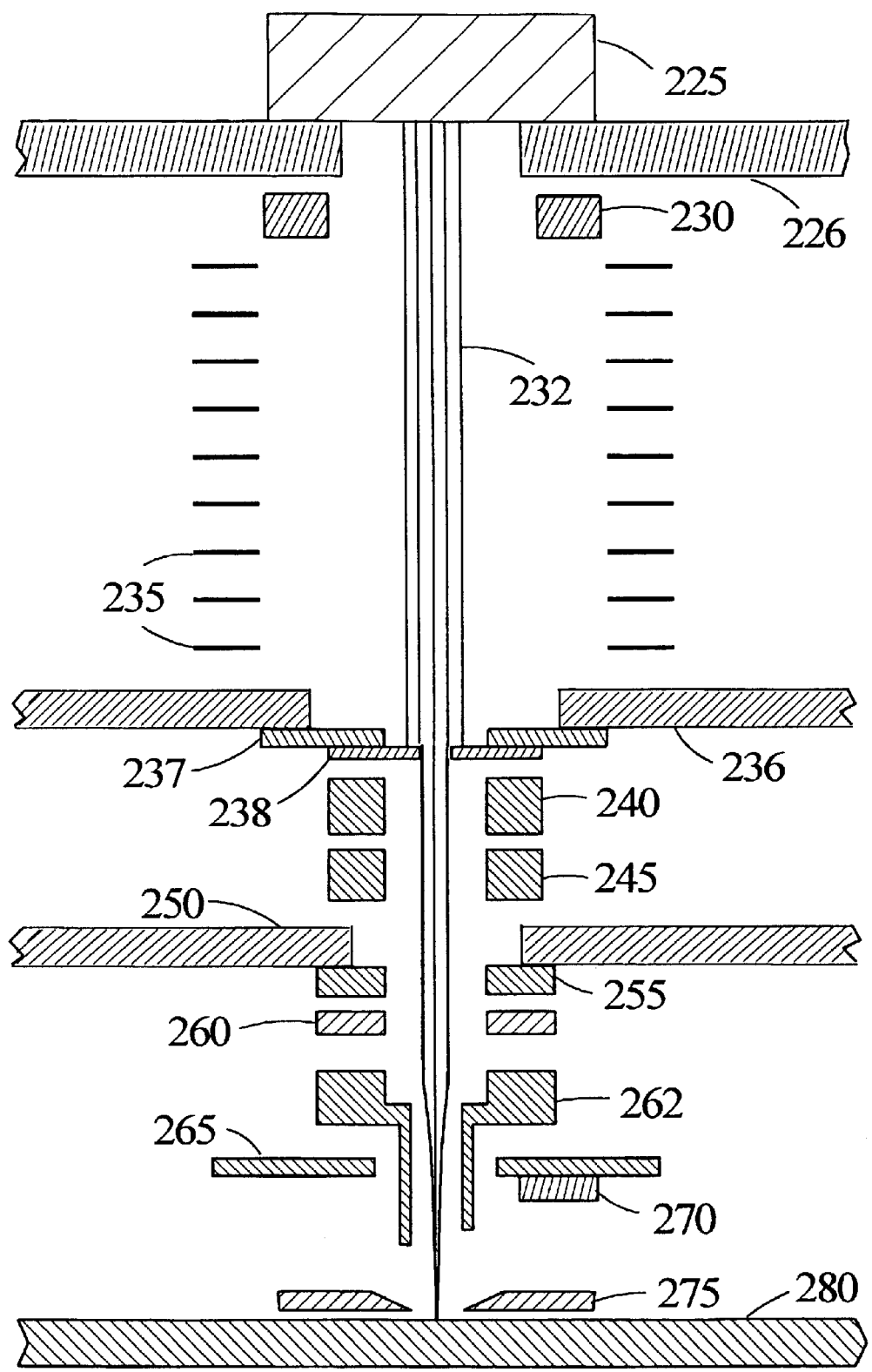
FIG. 2 shows a schematic cross-sectional representation of a single column within a multi-column assembly.

FIG. 2 shows a schematic cross-section of a single column within an electron optics assembly. In FIG. 2, electron gun 225, first accelerator electrode 226, alignment deflector 230, electron beam 232, accelerator plates 235, final accelerator electrode 236, final accelerator electrode disc 237, beam defining disc 238, mainfield scanning deflector 240, subfield scanning deflector 245, focus electrode mounting plate 250, first focus electrode 255, second focus electrode 260, field-free tube 262, detector plate 265, electron detector 270, voltage contrast plate 275 and substrate 280, are shown. Referring to FIG. 2, each electron optical column can be broken into 3 main sections: (1) the electron gun 225; (2) the accelerating region between first accelerator electrode 226 and the final accelerator electrode 236; and (3) the focusing and detecting optics. A simplified view of the column operation is as follows. The electron gun 225 creates a narrow, focused electron beam 232. The alignment deflector 230 steers the beam down the center of the column. The electron beam is accelerated to high energy through the accelerating region. The focusing electrodes 255, 260, and field-free tube 262 focus the beam to a small spot on the wafer while the scanning deflectors 240 and 245 scan the beam over the substrate 280 in a raster scan. The secondary electrons created by the beam 232 are captured by the electron detectors 270. The signal from the detectors 270 is passed on to an imaging computer for image processing and defect detection; an image computer suitable for a multi-column electron beam inspection system is described in U.S. patent application Ser. No. 10/125,054, incorporated by reference herein. Each column is roughly 160 mm in length, with the majority of the length represented by the accelerating region. Due primarily to the small scale of the column, in the preferred embodiment all of the lenses, rotators, deflectors, etc. are electrostatic; no magnetic elements are used. Most of the column components are precision-machined metals, insulating ceramics and conductive ceramics. Some of the more complex metal electrodes are screen printed onto ceramic; simpler electrodes maybe be brazed to ceramic. The function and operation of each component within the column will be discussed in detail below; further discussion of the electron optical column can be found in U.S. patent application Ser. Nos. 09/789,180 and 09/722,079, incorporated by reference herein.

In FIG. 2 the position of the electron gun 225 within the electron optical column is considered the "top" of the column, and the substrate 280 is located at the "bottom" of the column. Each column has its own electron gun 225 producing a parallel beam of electrons 232. The alignment deflector 230 steers the beam 232 down the column into the ideal position for the lower column optics. This alignment deflector 230 is an independent deflector for each column in the multi-column inspection tool. In the preferred embodiment, the alignment deflector 230 is a set of double octupole deflectors. The purpose of the alignment deflector 230 is to make every source appear as if it is emitting directly on the optical axis of the column. Two deflectors are required because both trajectory and position may need to be corrected. The first deflector bends the beam, thereby directing it towards the intersection of the optic axis with the midplane of the second deflector, and the second deflector bends the beam such that its trajectory is parallel to the optical axis and the center of the beam is coincident with the optic axis. On-axis beams have significantly less aberrations when passing through lenses, stigmators and deflectors.

In the preferred embodiment, the accelerating region can be made up of a set of accelerator plates 235 with a large aperture such that the electron optical axes of all the columns in the electron optics assembly are within the aperture and the accelerating field within the aperture is uniform. In other embodiments, the accelerator plates 235 may extend over the whole area of the assembly, with apertures for each column. In further embodiments, the accelerating region can be made from resistive ceramic in one piece with apertures for each column (not shown). A linearly increasing potential in the accelerating region is desirable because it does not introduce lensing effects that could distort the electron beam. The accelerating region might typically accelerate the electron beam from hundreds to thousands of eV, for example with 600V on the first accelerator electrode 226 and 6 kV on the final accelerator electrode 236.

As seen in FIG. 2, after passing through the accelerating region, the electron beam 232 passes through the aperture in the beam defining disc 238, which further reduces the diameter of the beam 232. The beam 232 then passes through the mainfield and subfield scanning deflectors 240 and 245. In a preferred embodiment, the mainfield deflector 240 is composed of a set of double deflection octupoles, requiring 16 electrical connections. Two octupole deflectors are used in order to ensure that the beam 232 is telecentrically scanned on the substrate 280. The mainfield deflectors 240 have four functions: (1) tracking the stage motion as it moves the substrate during imaging, (2) performing a large area scan to find alignment marks on the substrate, (3) correcting for X-Y positional errors of individual columns relative to a defined array and (4) stigmating the beam. In a preferred embodiment, the subfield deflector 245 is a quadrupole deflector with 4 independent electrodes. In another embodiment, an octupole deflector could be used. The subfield deflector 245 is used to scan the beam 232 over the substrate during the imaging process.

As shown in FIG. 2, the beam 232 then passes through the focusing optics—first focus electrode 255, second focus electrode 260 and field-free tube 262. In a preferred embodiment first focus electrode 255 and second focus electrode 260 are simple cylindrical lenses with a bore diameter of roughly 2 mm. The strongest focusing occurs between second focus electrode 260 and the field-free tube 262, as this is the region of highest electric field. Typical potentials applied to the focus elements are as follows: first focus electrode=6,000 V, second focus electrode=4,500 V and field-free tube=980 V. The potential on second focus electrode 260 is the primary adjustment used to obtaining a focused spot on the substrate 280. In a preferred embodiment, the potentials on the second focus electrodes 260 are independently controlled for each column, while the potentials on the first focus electrodes 255 and the field-free tubes 262 are common to all of the columns in the electron optics assembly. The field-free tube 262 is held at a potential that is slightly lower than that of the substrate 280. In a preferred embodiment, the substrate 280 is held at 1 kV and the field-free tube 262 is held at 980 V. The purpose of the field-free tube 262 is to separate the secondary electrons (emitted from the substrate surface) from the primary electrons (in the beam 232), and to shield the electron beam 232 from the electric field of the electron detectors 270. Most secondary electrons have an energy that is less than 10 eV relative to the substrate 280, depending on the surface material of the substrate, the primary electron energy, etc. The secondary electrons are emitted in roughly a Lambertian angular distribution (cos θ) from the substrate surface and travel towards the field-free tube 262. However, the secondary electrons have insufficient energy to enter the tube 262 because of the negative voltage differential between the field-free tube 262 and the substrate 280. Thus, the secondary electrons will be pushed away from the field-free tube 262. A few of the secondary electrons return to the substrate 280, but the majority of the electrons are accelerated toward the electron detectors 270 (held at roughly 5 kV).

The voltage contrast plate 275, as shown in FIG. 2, is positioned directly above the substrate 280 (roughly 100 $\mu$m in the preferred embodiment). It has two functions: (1) enhance secondary electron collection efficiency and (2) allow for voltage contrast imaging of the wafer surface. This spacing can be maintained by using an electrostatic chuck (not shown) to hold the substrate 280 down flat, and by using several laser triangulators on the electron optics assembly (not shown) to allow for correction of the substrate 280 position relative to the voltage contrast plate 275. Details of such a substrate positioning system are given in U.S. Pat. No. 6,355,994, incorporated by reference herein. The voltage contrast plate 275 has a small (roughly 1 mm) hole through which the primary and secondary electrons travel; in a preferred embodiment the sides of the hole are beveled at an angle of arctan[sqrt(0.5)] with respect to the substrate surface, so as to assist in creating a field-free region on the substrate 280 when the voltage contrast plate 275 is held at a potential very close to that of the substrate 280 (typically about 995 V if the substrate is at 1 kV). This field-free region prevents the extraction of excessive numbers of secondary electrons from the surface of substrate 280, thus preventing undesirable positive charging of the surface of substrate 280. The voltage applied to the voltage contrast plate 275 can be adjusted so as to force low energy secondary electrons back to the substrate surface. If the secondary electrons have sufficient energy, then they will be able to escape this field and reach the electron detectors 270; however, if the secondary electrons do not have sufficient energy, then they will return to the substrate 280. Thus, the voltage contrast plate 275 can act as an electron energy high pass filter, blocking low energy electrons and allowing high energy electrons to be detected. The potential can be adjusted so that the high pass electron energy filter can be tuned. Furthermore, the efficiency of secondary electron detection can be improved utilizing the approaches described in U.S. patent application Ser. No. 10/126,943, incorporated by reference herein.

The electron detector 270, shown in FIG. 2, is typically either a uniform annular detector, or a multi-sectored detector. A multi-sectored detector can detect topographical information by adding angular information to the detected signal. In a preferred embodiment, the electron detector 270 is a four-quadrant detector held at a potential of roughly 5 kV. With a state-of-the art solid state detector, calculations indicate that the imaging bandwidth can be 100 MHz or higher.

As shown in FIG. 2, the first accelerator electrode 226, the final accelerator electrode 236 and the focus electrode mounting plate 250 extend beyond the single column; as will be discussed in more detail below, they are continuous through the entire electron optics assembly, providing mechanical integrity and simplifying electrical connections.

Figure 3:
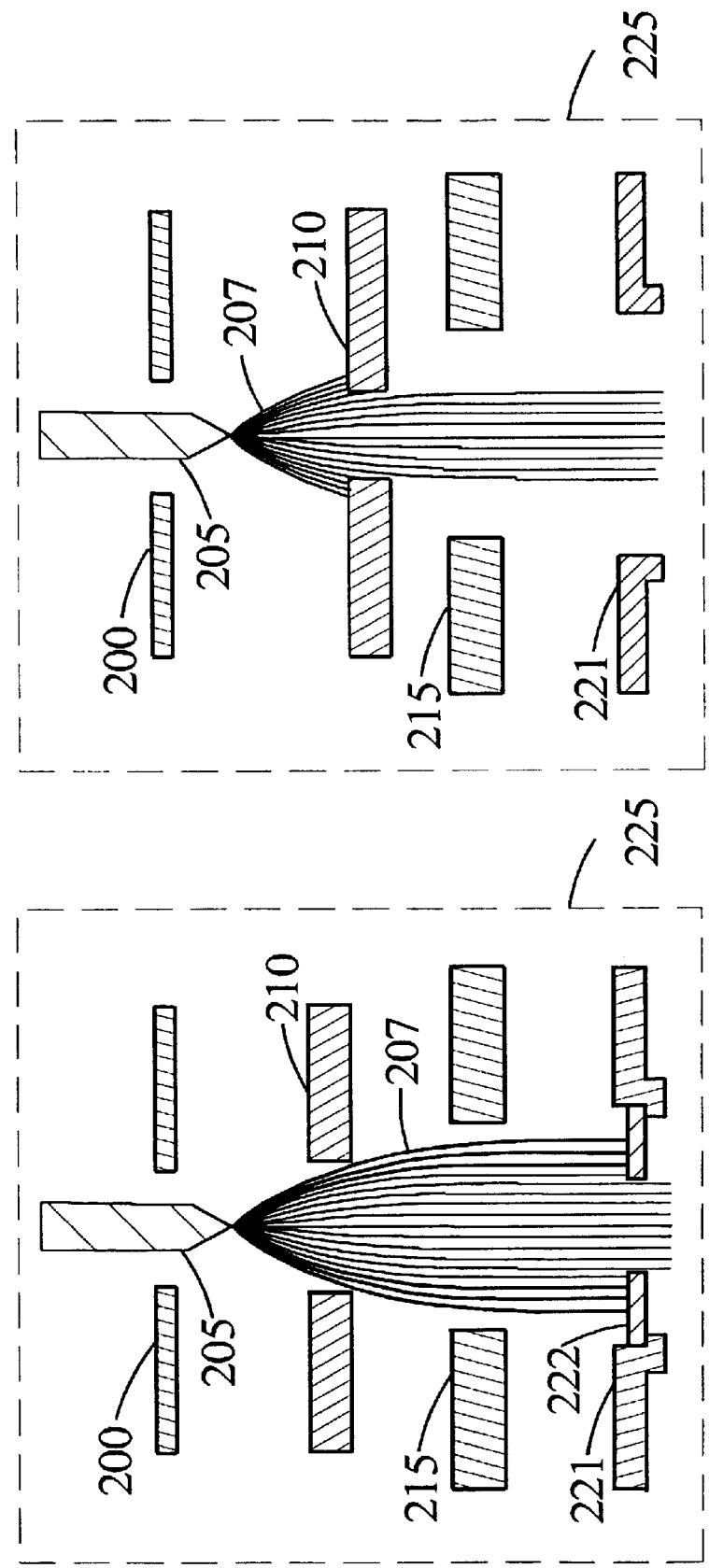
FIG. 3a shows a schematic representation of an electron gun with the electron beam apertured at the source plate.
FIG. 3b shows a schematic representation of an electron gun with the electron beam apertured at the extraction electrode.

FIGS. 3a and 3b show schematic cross-sectional representations of preferred embodiments of the electron gun 225. In FIGS. 3a and 3b, suppressor electrode 200, electron emitter 205, electron trajectories 207, extraction electrode 210, focus electrode 215, source alignment plate 221, source beam defining disc 222 and electron gun 225, are shown. The two embodiments shown differ only in the position of the electron beam aperture—a beam defining disc 222 is used in FIG. 3a and the extraction electrode 210 is used to aperture the beam 207 in FIG. 3b. The electron emitter 205 may be a thermal field emitter and in preferred embodiments is a Schottky-type emitter. The electron guns 225 shown in FIGS. 3a and 3b have two important properties, pertinent to their use in a multi-column electron beam application: (1) the electron beam 207 is apertured within the electron gun 225, thereby reducing the current in the electron beams 232 in the electron optics assembly, which minimizes undesirable beam-to-beam interactions and (2) the electrons from the sources 205 are focused into parallel beams, which is desirable for illuminating the apertures in the beam defining discs 238. An example of electrode potentials for the embodiment shown in FIG. 3b, with a Schottky emitter, are: emitter 205 at 0V, extraction electrode 210 at 2800V and focus electrode 215 at 400V.

In other embodiments, electron gun 225 may be comprised of a single cold field emitter, or a multiplicity of redundant cold field emitters, as described in more detail in U.S. patent application Ser. Nos. 09/789,180 and 09/722,079, herein incorporated by reference.

Figure 4:
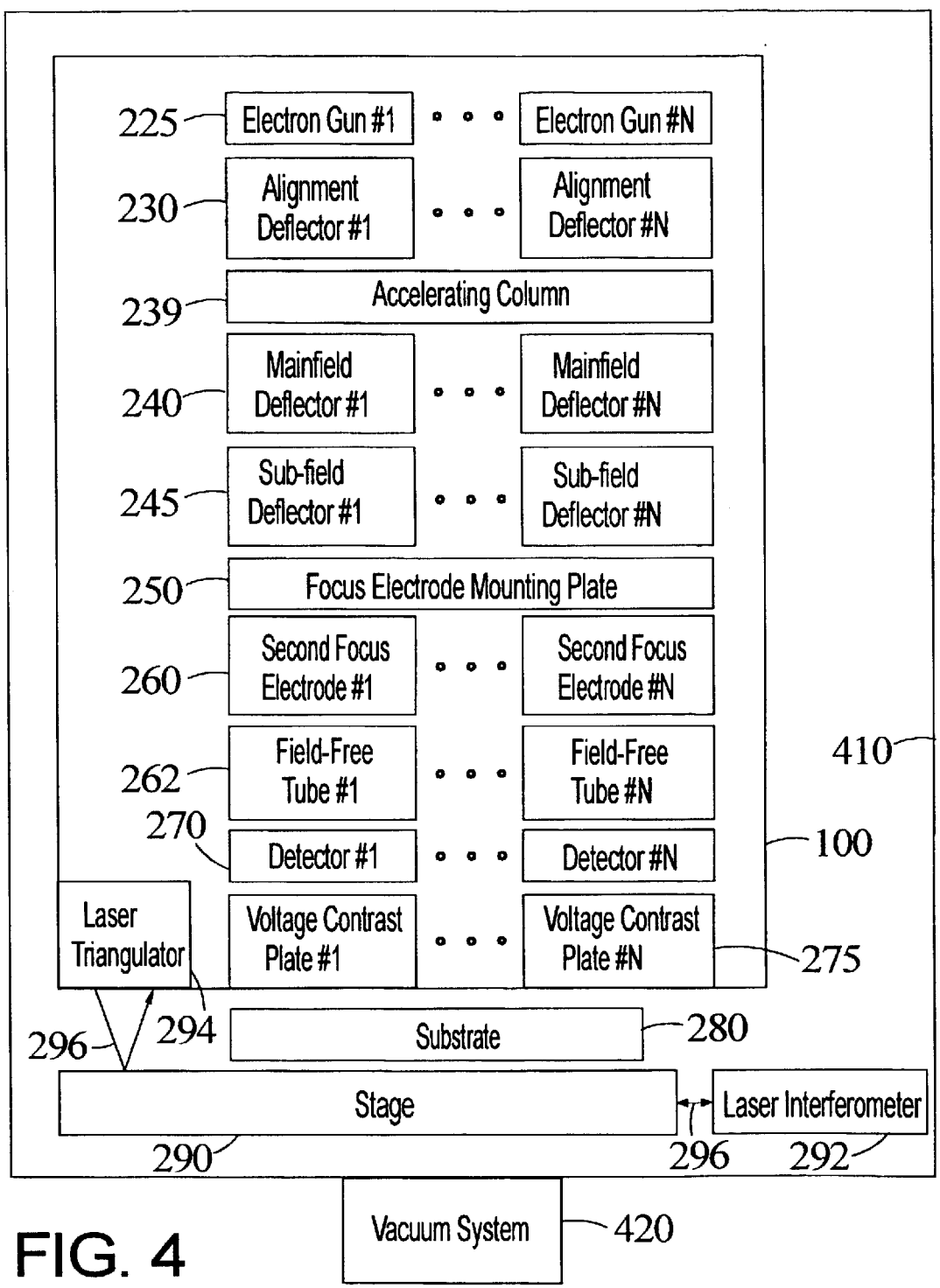
FIG. 4 shows a block diagram of a multi-column assembly and wafer stage.

FIG. 4 shows a block diagram of an electron optics assembly integrated with a stage, both of which are contained within a vacuum enclosure. In FIG. 4, electron optics assembly 100, electron guns 225, alignment deflectors 230, accelerating column 239, mainfield scanning deflectors 240, subfield scanning deflectors 245, focus electrode mounting plate 250, second focus electrodes 260, field-free tubes 262, electron detectors 270, voltage contrast plates 275, substrate 280, stage 290, laser interferometer 292, laser triangulator 294, laser beams 296, vacuum chamber 410 and vacuum system 420, are shown. The electron optics assembly 100 is shown to comprise N columns, where N is in the range of 2 to several hundred. The components of the electron optics assembly 100 are shown to be either one per column, such as the electron guns 225, or one per assembly, namely the accelerating column 239 and focus electrode mounting plate 250; the accelerating column 239 and focus electrode mounting plate 250 provide mechanical integrity to the electron optics assembly 100 and simplify the manufacturing of the assembly. One or more laser triangulators 294 are rigidly attached to the electron optics assembly 100 and are used to accurately measure the position of the stage 290 relative to the assembly 100. The substrate 280 is held on the stage 290, a preferred embodiment uses an electrostatic chuck (not shown) for this purpose. Three laser interferometers 292 are used to measure the X-Y-Yaw position of the stage 290. The integrated stage 290 and electron optics assembly 100 are contained within a vacuum chamber 410; the vacuum within the chamber 410 is maintained by vacuum system 420.

Figure 5:
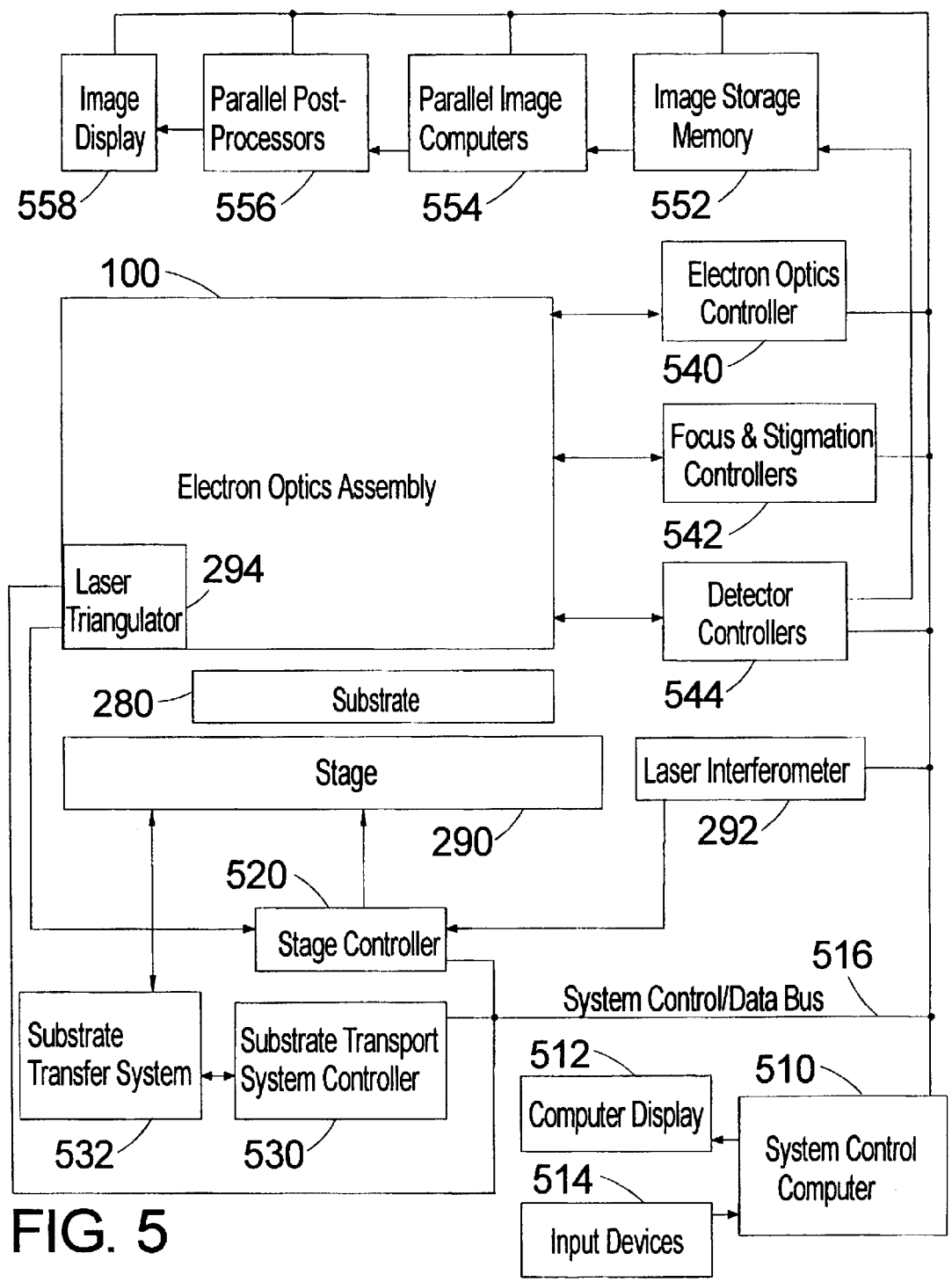
FIG. 5 shows a block diagram of a multi-column electron beam inspection system, with data and control interconnections.

FIG. 5 shows a block diagram of the multi-column electron beam inspection system, with data and control communication pathways. In FIG. 5, electron optics assembly 100, substrate 280, stage 290, laser interferometer 292, laser triangulator 294, system control computer 510, computer display 512, input devices 514, system control/data bus 516, stage controller 520, substrate transport system controller 530, substrate transfer system 532, electron optics controller 540, focus and stigmation controllers 542, detector controllers 544, image storage memory 552, parallel image computers 554, parallel post-processors 556 and image display 558, are shown. The system control computer 510 provides overall system control and coordinates the operation of the subsystem controllers. The subsystem controllers are: a substrate transport system controller 530 which controls substrate movement in and out of the inspection system and in and out of the vacuum chamber for electron beam inspection; a stage controller 520 which controls the position and movement of the stage 290; electron optics controller 540, focus and stigmation controllers 542, and detector contollers 544, which together control all of the electron optics functions within the electron optics assembly 100 (further details are given in U.S. patent application Ser. Nos. 09/789,180 and 09/722,079, incorporated by reference herein); and the image storage memory 552, parallel image computers 554, parallel post-processors 556, and image display 558 which together constitute an image computer, such as that described in U.S. patent application Ser. No. 10/125,054, incorporated by reference herein. The system control computer 510 is connected to operator interfaces: a computer display 512 and input devices 514. The input devices 514 enable the system operator to enter pre-defined process recipes which describe various details of the inspection process, such as the pixel size, diameter of the electron beam 232 at the surface of substrate 280, imaging speed (in pixels/s), the arrangement and sizes of the dies on the substrate 280, areas of each die to be inspected, etc. The substrate transfer system 532 will typically include one or more loadlocks for storing substrates to be inspected and substrates which have already been inspected, a substrate pre-aligner for initial wafer positioning prior to loading on the stage 290, as well as a robot for transferring substrates 280 between the loadlock, pre-aligner and stage 290. Laser interferometers 292 and laser triangulators 294 are utilized in the control of the stage 290, as described above.

Inspection of a wafer for defect detection in IC manufacturing is currently performed in the following modes: array, die-to-die, and die-to-database modes. Defects can be detected by comparing an image of the location under inspection with an area that contains the same pattern information that is either generated from a database or acquired from another region on the wafer. In the die-to-die mode the pattern information is acquired from the corresponding area of a neighboring die. In array mode the pattern information is acquired from the same die but from an area of a repeating pattern such as that of a DRAM. These comparisons are done with a specialized image computer. A critical element of the multiple column approach is the alignment of the images or data from each column, so that a comparison of different areas on the wafer is performed with the same pattern information. Ideally, all the columns would have a pitch or spacing that was equal to the die or reticle pitch or spacing. (A reticle field is the area printed by a mask which can contain more than one die or chip.) In this case all the columns would be aligned with the same image information. In the case where the column pitch is not equal to the die or reticle field pitch, the image data is electronically aligned in a computer memory.

Figure 6A:
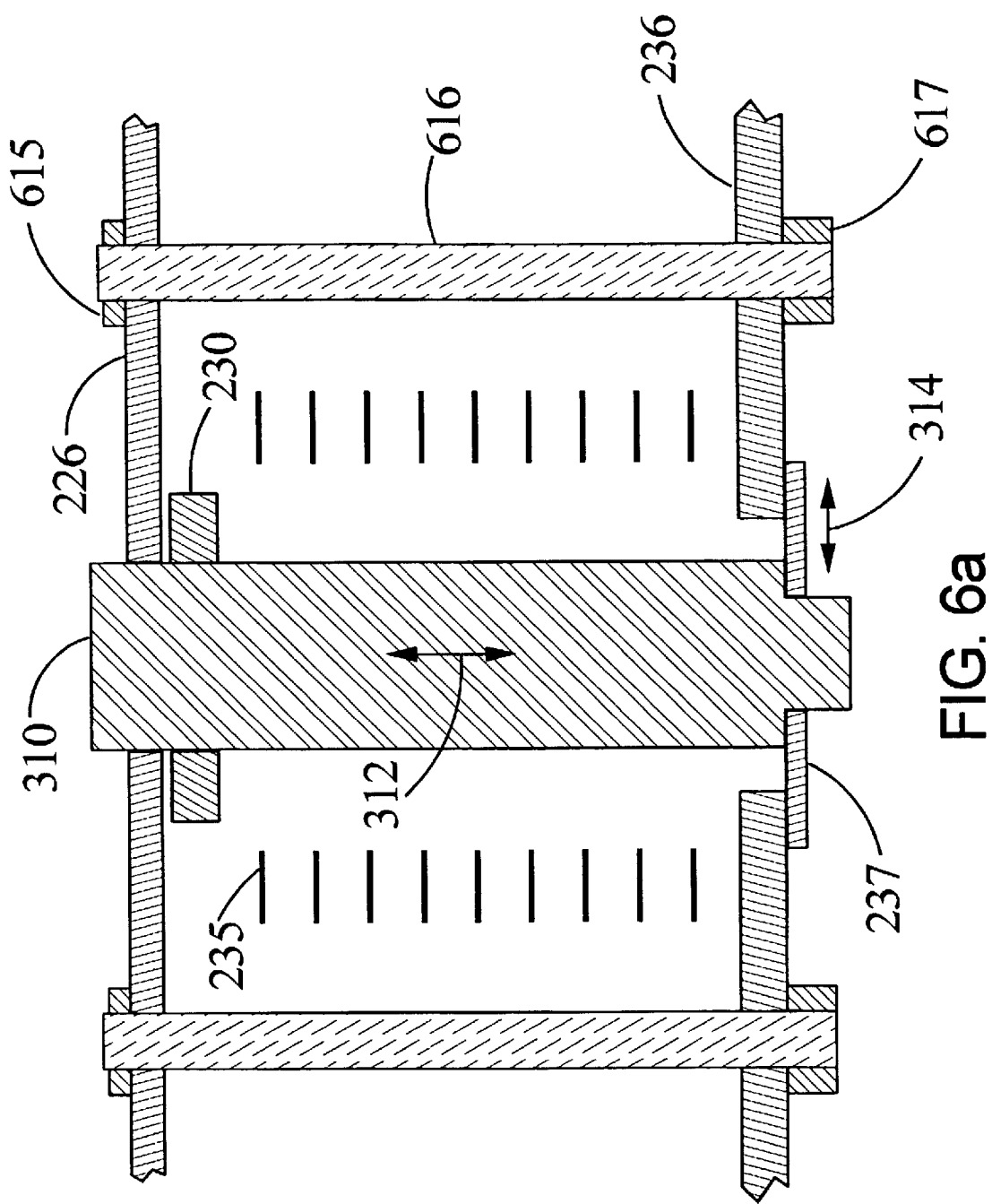
Figure 6B:
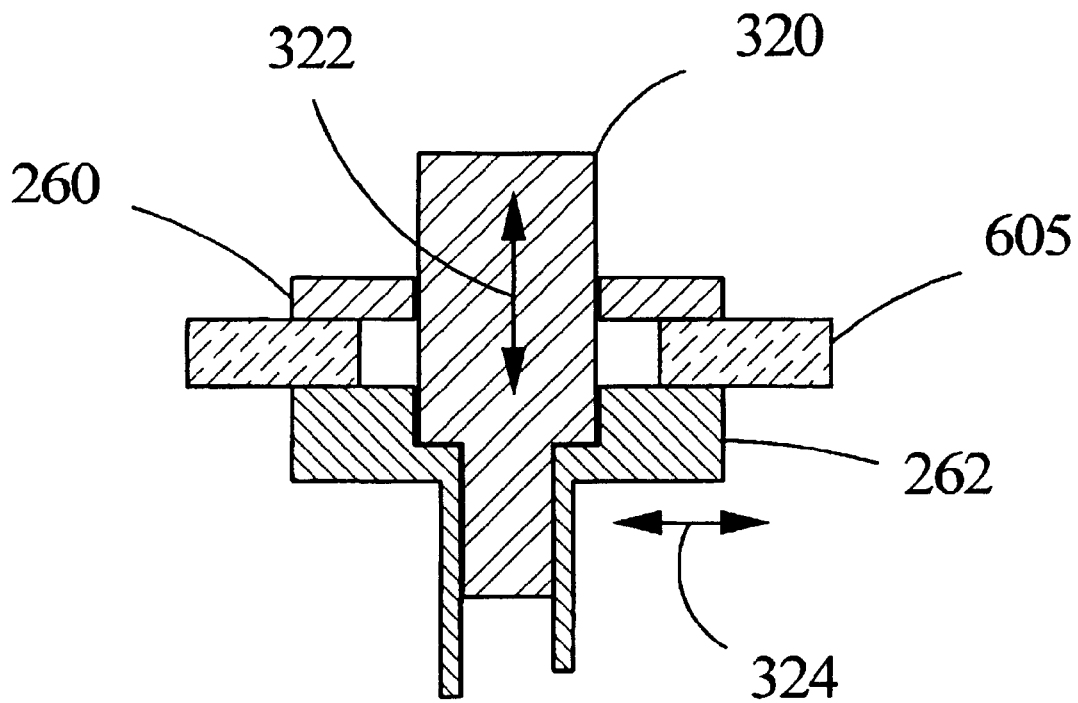
Figure 6C:
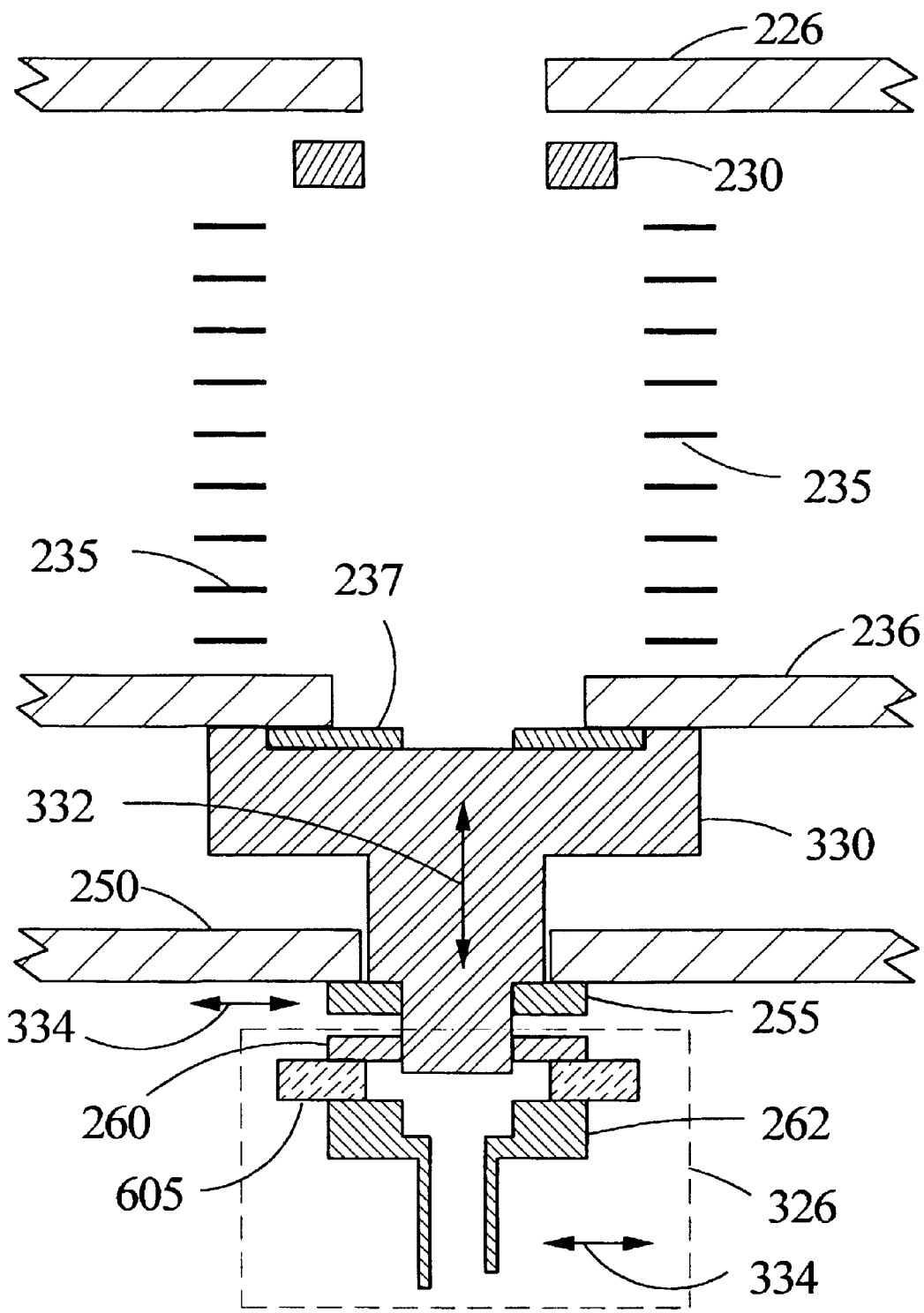
Figure 6D:
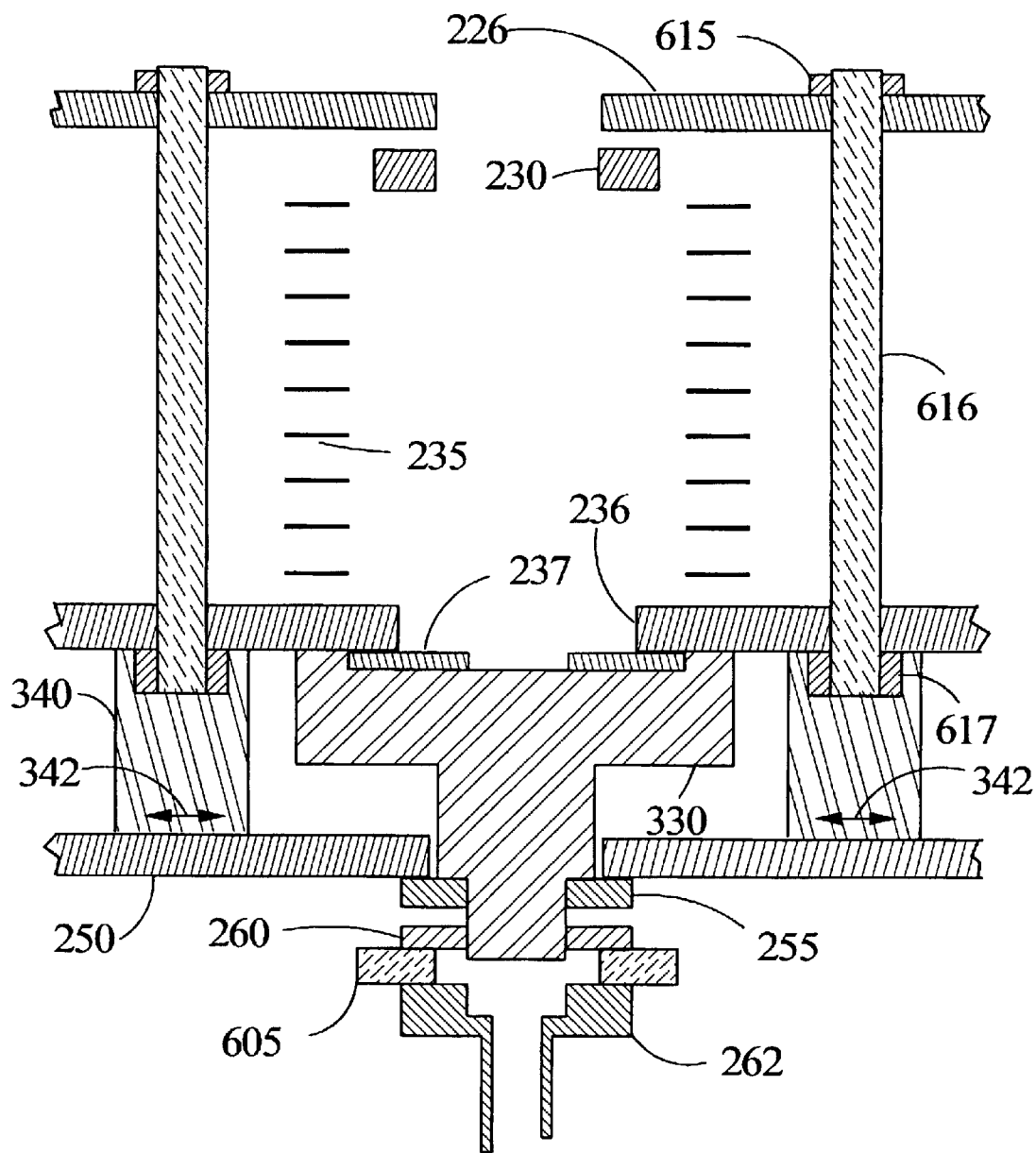
Figure 6E:
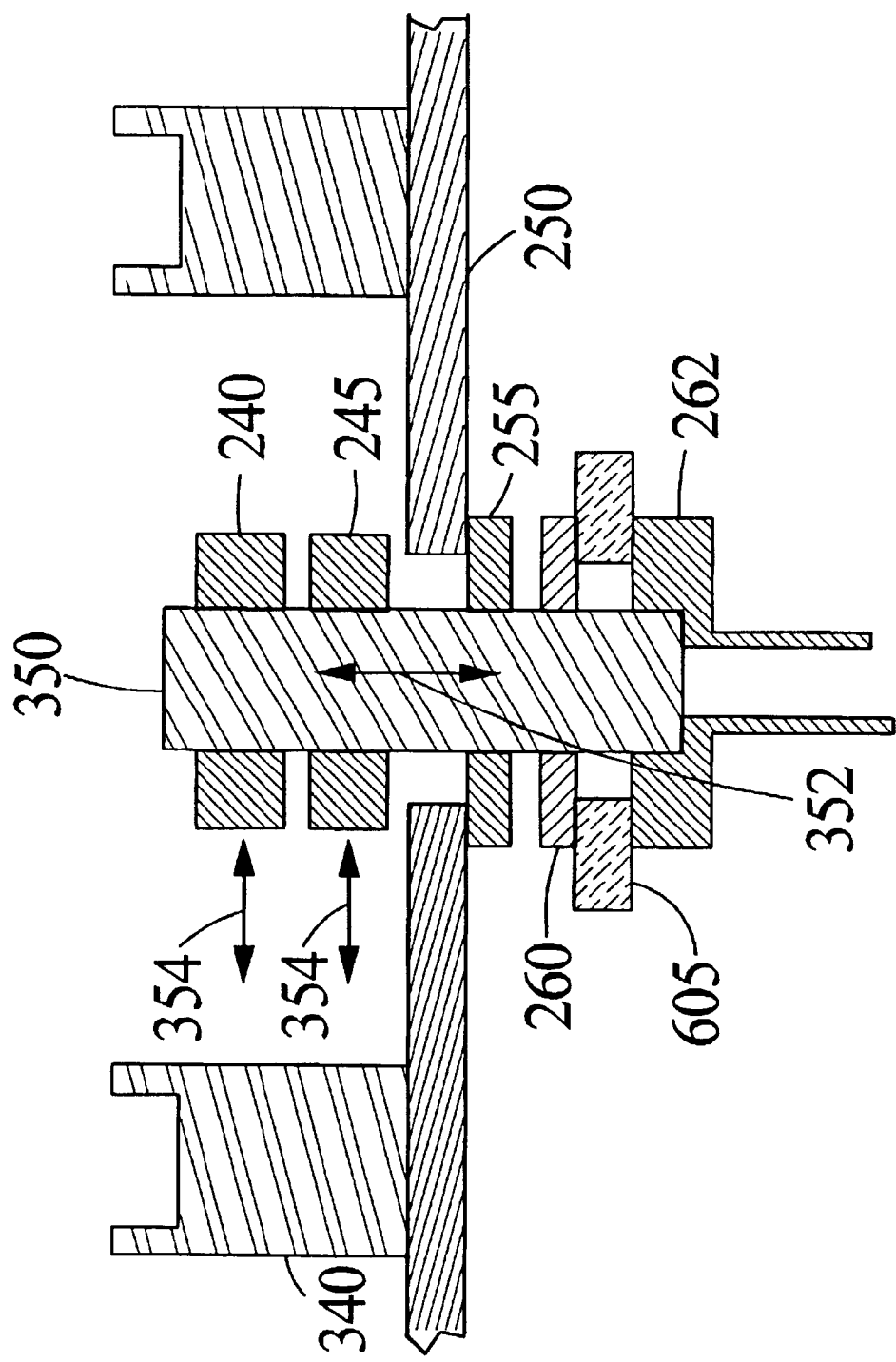
Figure 6F:
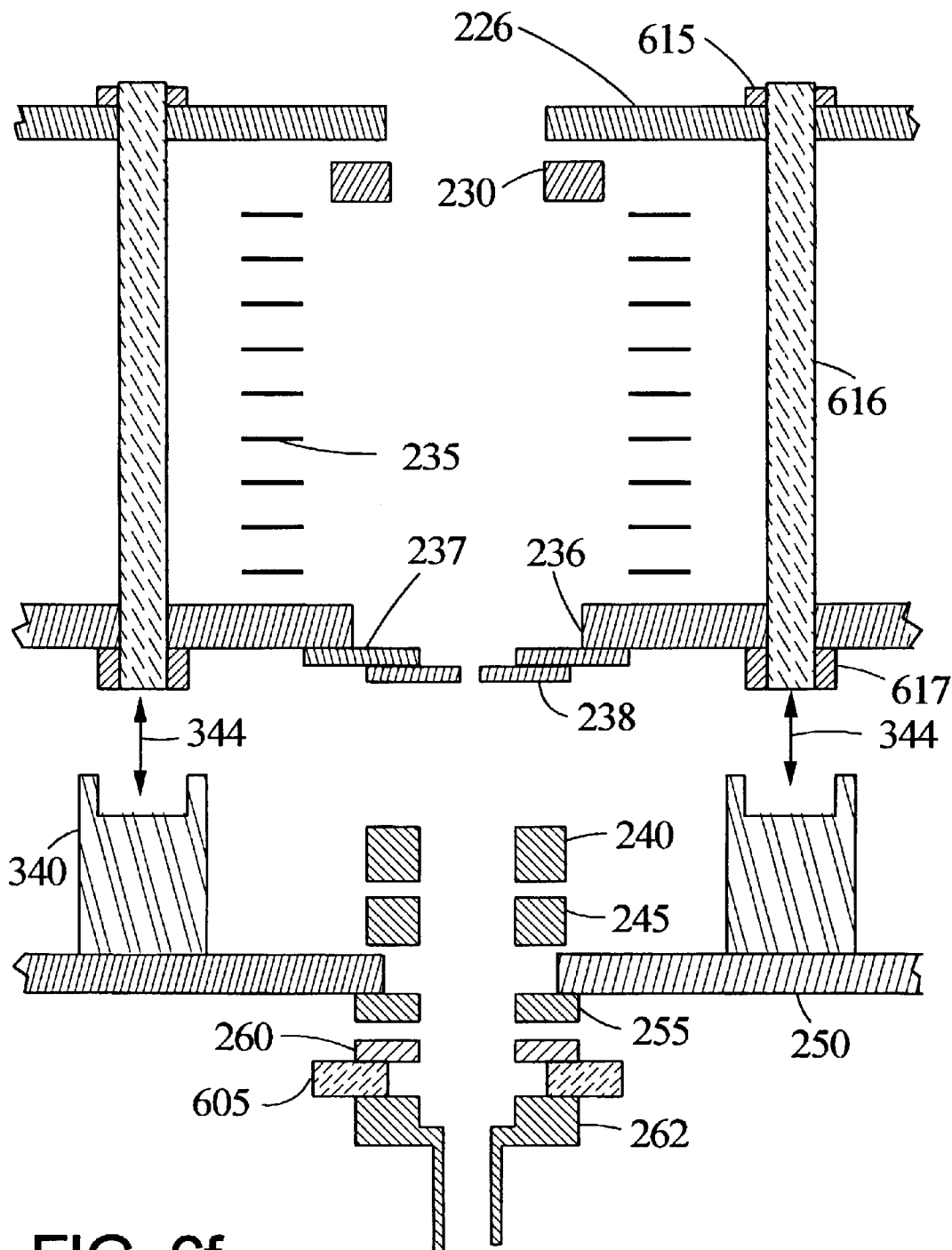
Figure 6G:
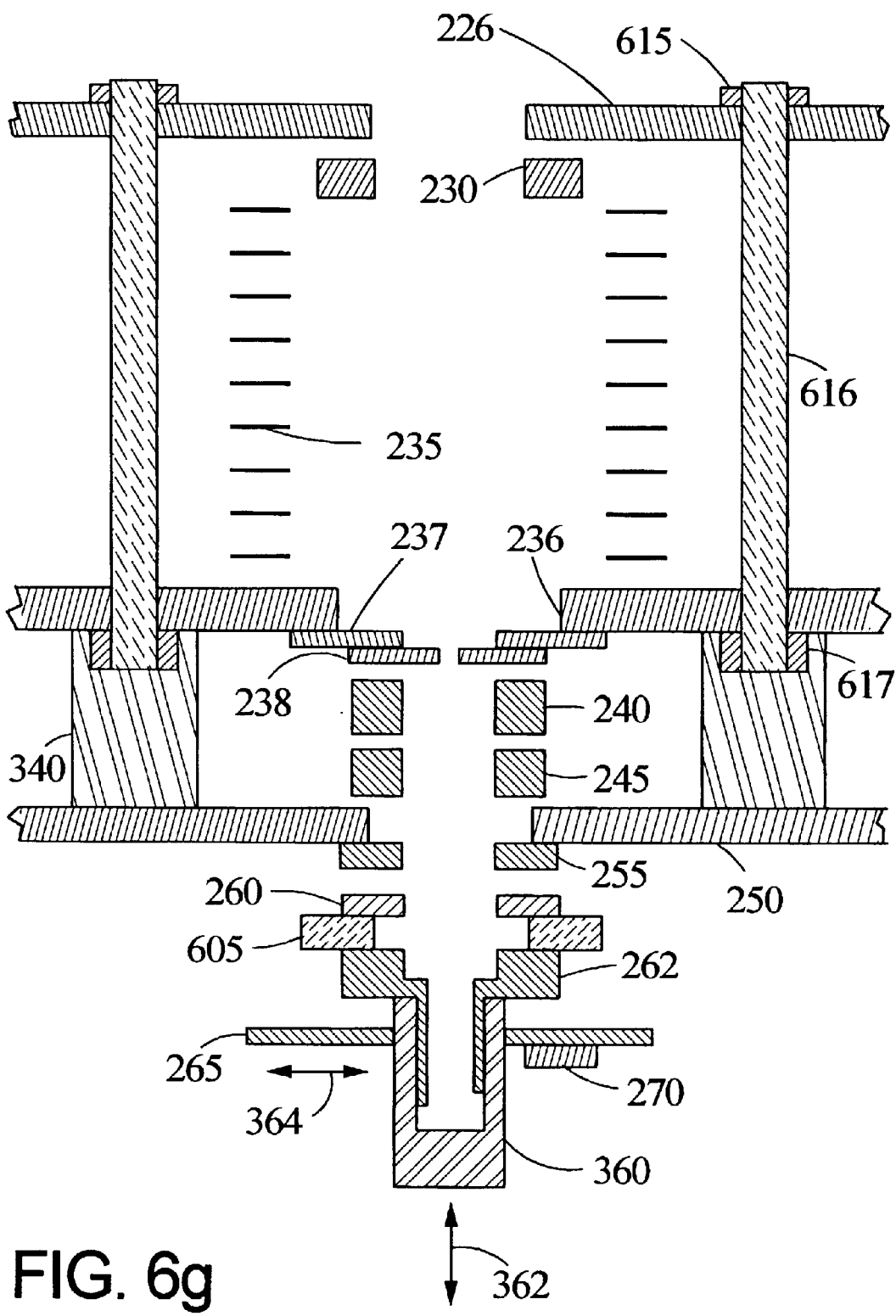
Figure 6H:
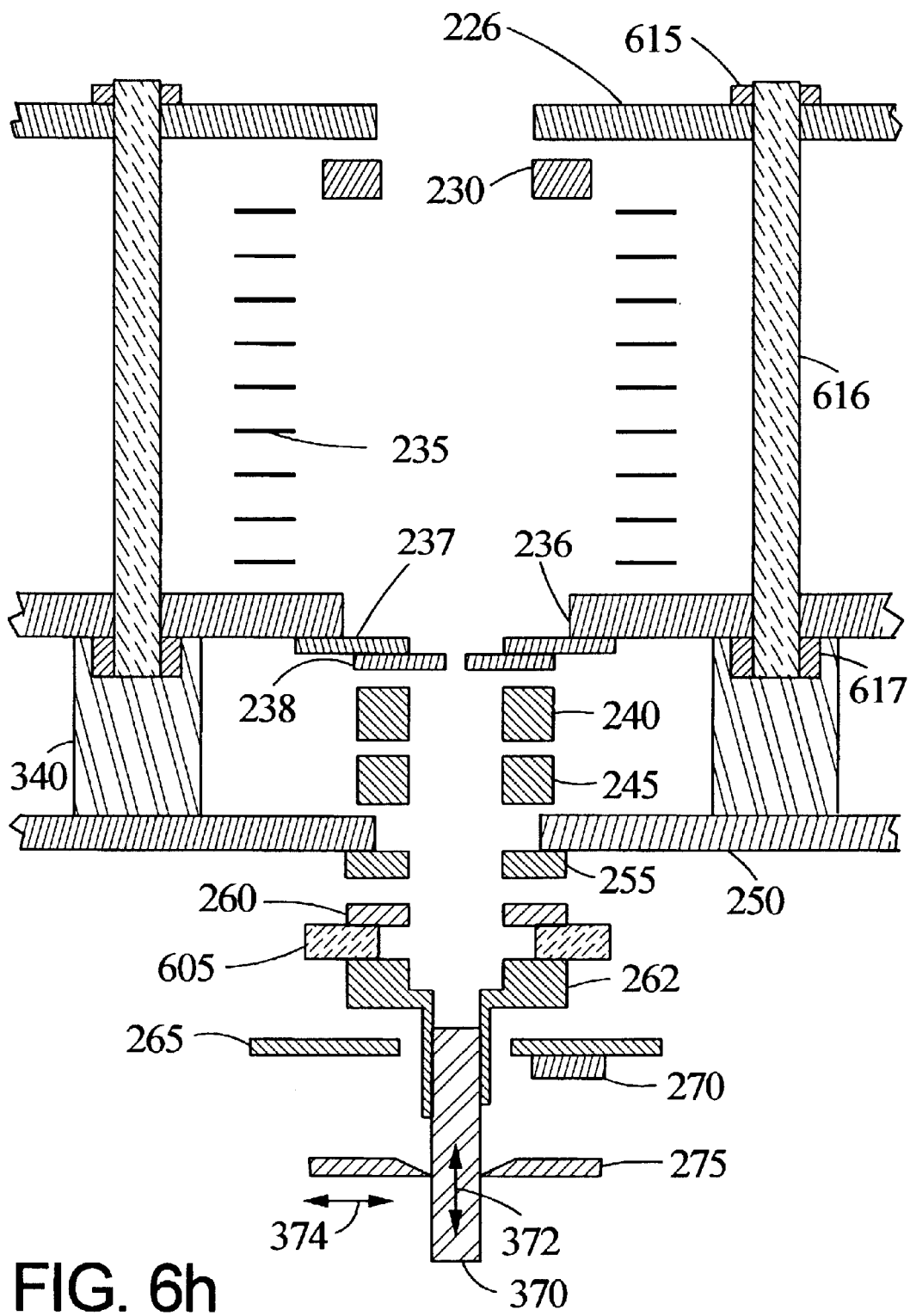
Figure 6I:
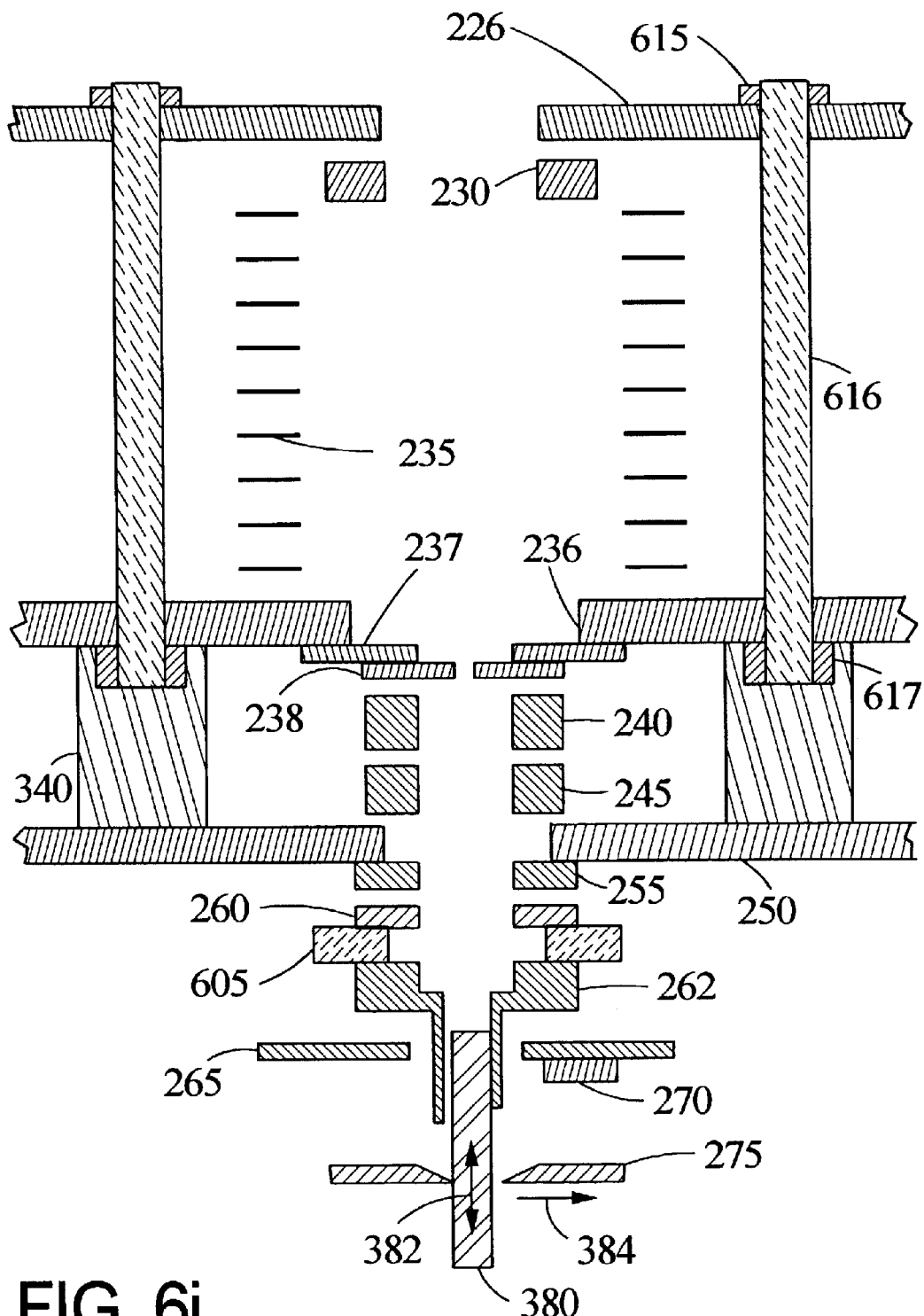
Figure 6J:
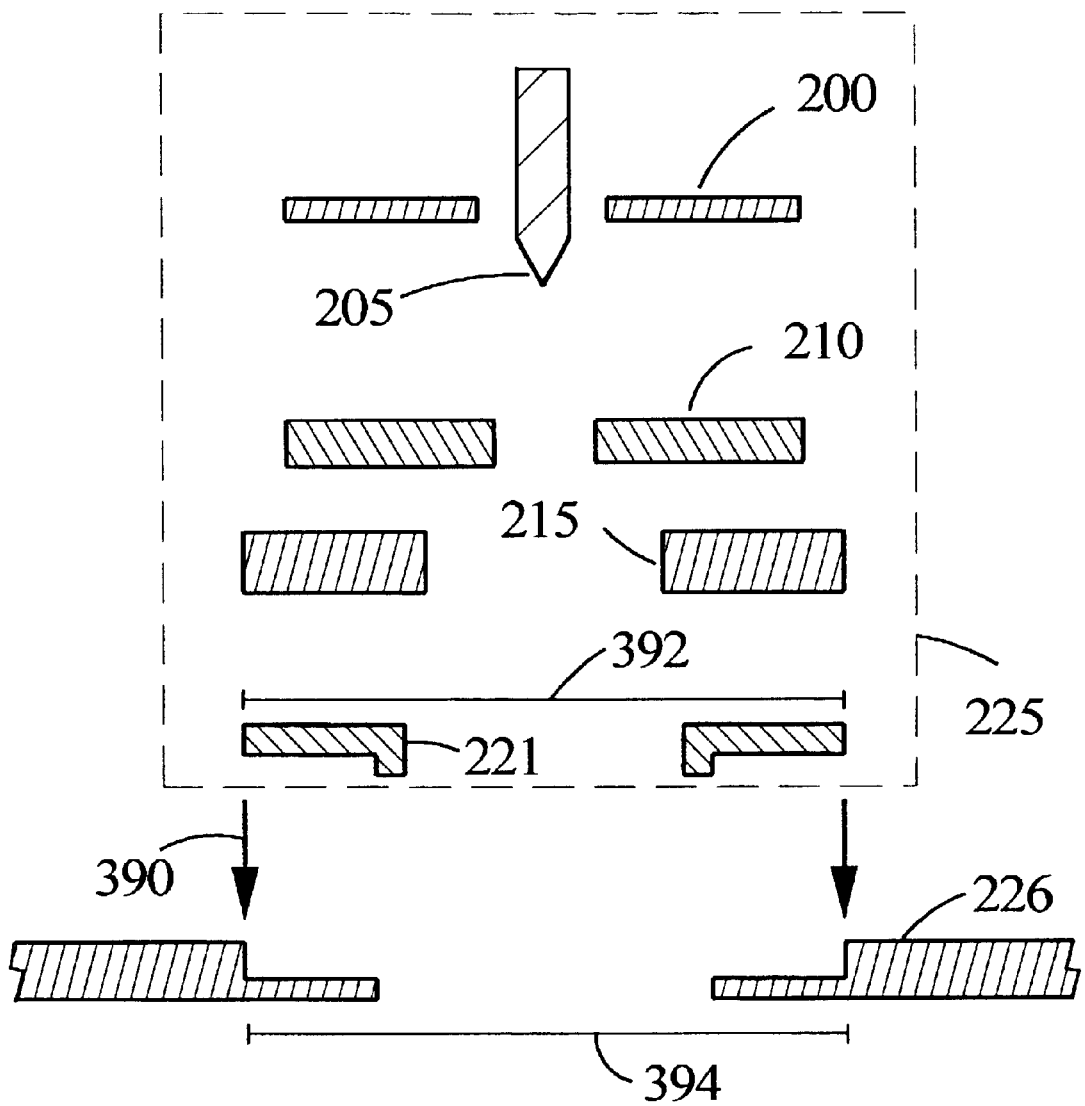
Figure 6K:
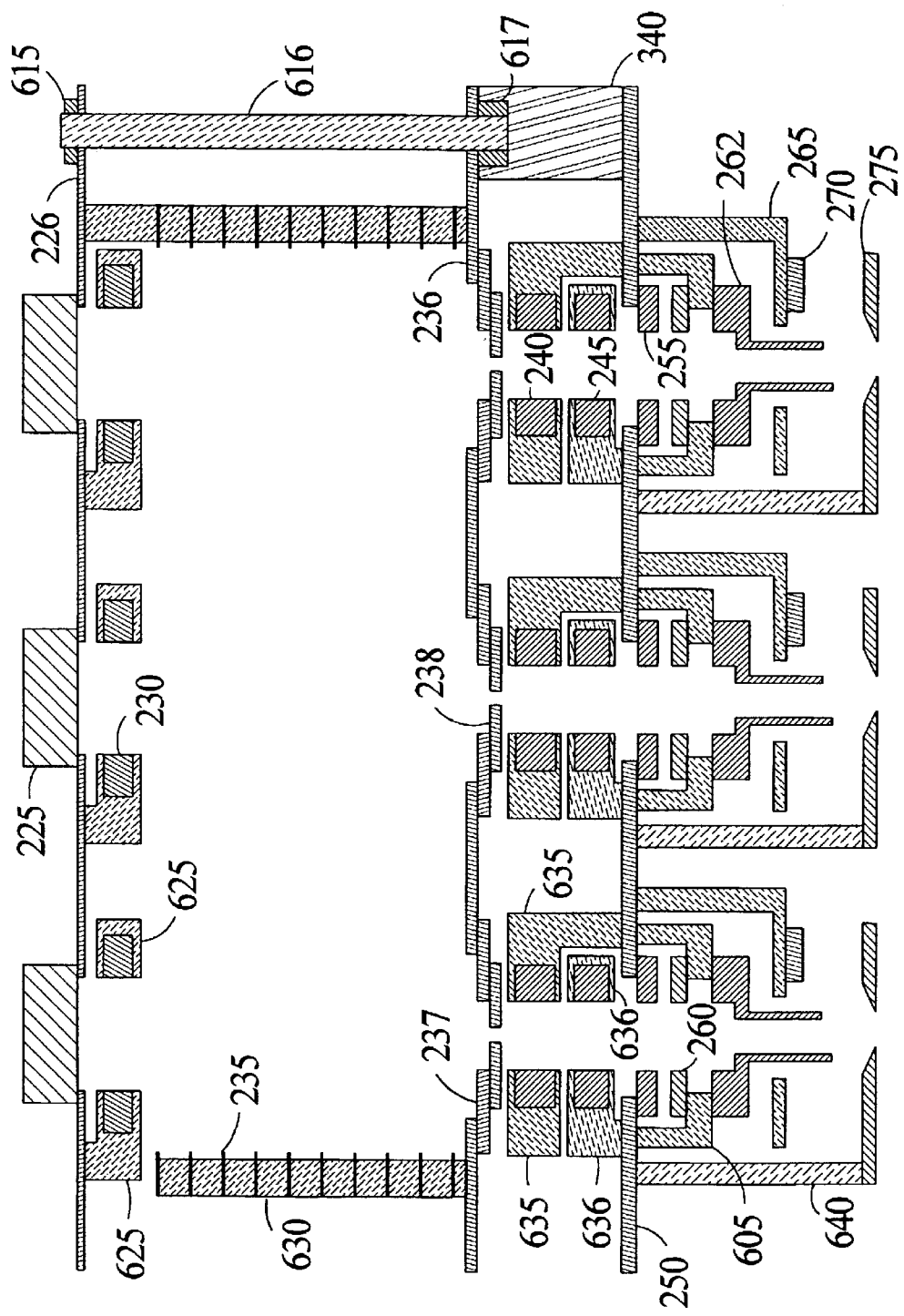
Figure 61:
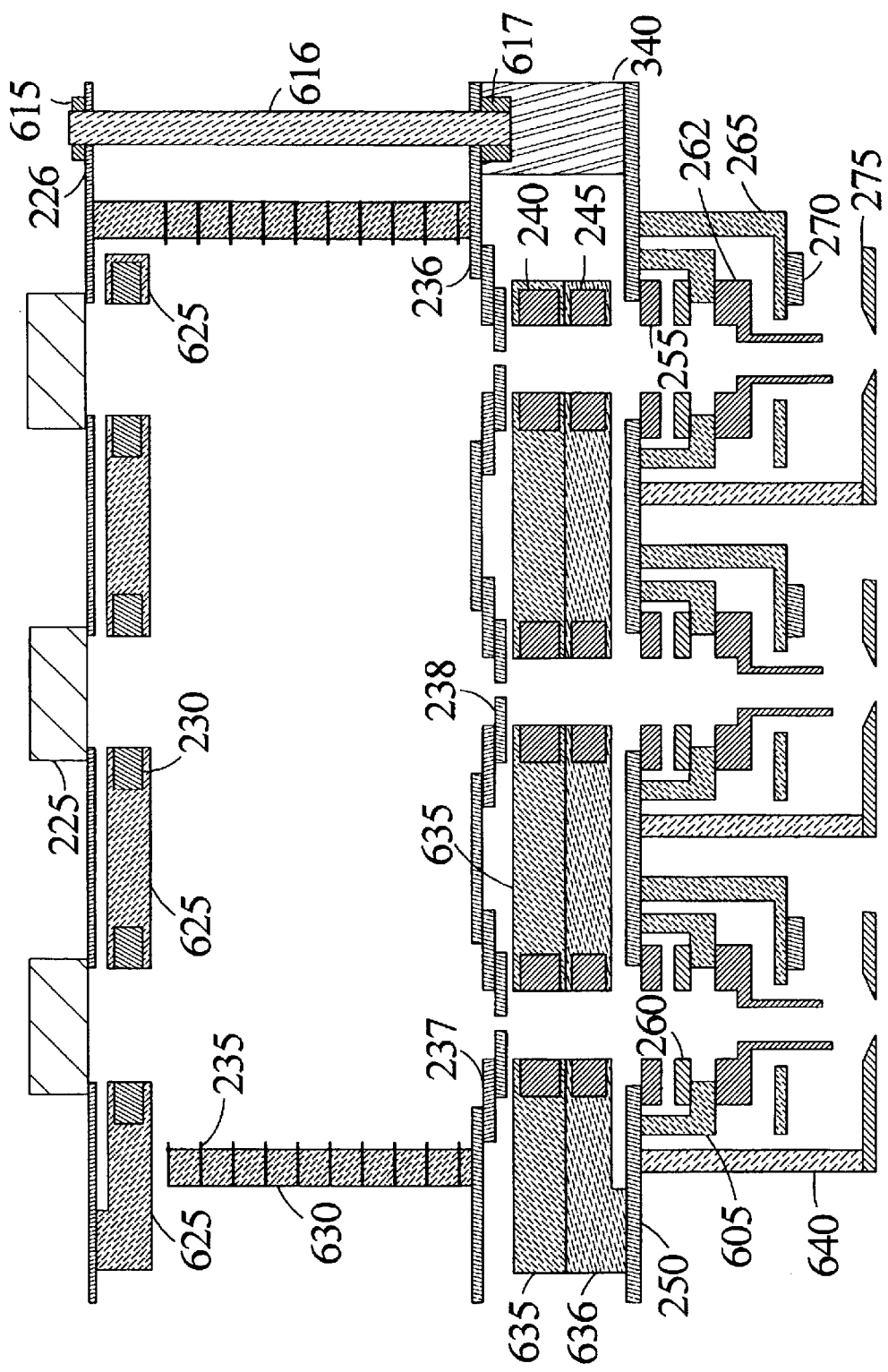

FIGS. 6a–6k show how the components of the electron optics assembly are assembled and aligned. For clarity, many of the support and securing structures are not shown in FIGS. 6a–6j; however, support structures are shown in FIGS. 6k and 6l.

In FIG. 6a, the alignment procedure for the upper (accelerator) part of the assembly is shown by a schematic cross-section. In FIG. 6a, first accelerator electrode 226, alignment deflector 230, accelerator plates 235, final accelerator electrode 236, final accelerator electrode disc 237, accelerator alignment rod 310, accelerator alignment rod insertion/removal direction 312, accelerator alignment direction 314, upper securing nuts 615, securing bolts 616, and lower securing nuts 617 are shown. The critical alignment for this step is the concentric alignment of the apertures in the final accelerator electrode discs 237 with the corresponding apertures in the first accelerator electrode 226. Accelerator alignment rods 310 are inserted into each column in the assembly; the rods 310 are moved in the direction indicated by insertion/removal direction 312. There is a sliding locational fit between the rods 310 and first accelerator electrode 226, alignment deflectors 230 and final accelerator electrode discs 237, which are movably attached to the final accelerator electrode 236. (Note that the apertures in the final accelerator electrode 236 are designed to be large enough to allow proper alignment of the final accelerator electrode discs 237 for all columns.) The freedom of motion in the plane of the figure of the final accelerator electrode discs 237 is shown by accelerator alignment direction 314 (the freedom of motion is beyond what is shown, being in all directions in the plane perpendicular to the plane of the figure). After positioning with rods 310, (1) the accelerator electrode discs 237 are firmly attached to the final accelerator electrode 236, using screws, or equivalent and (2) the alignment deflectors 230 are firmly attached to the first accelerator electrode 226 using screws, or equivalent (note that through holes are provided in the electrode 226 so that attachment of the alignment deflectors can be effected from the top surface of electrode 226). A plurality of bolts 616, with upper nuts 615 and lower nuts 617 hold the upper part of the electron optical column firmly together, maintaining concentricity of the apertures in the first accelerator electrode 226 with those in the final accelerator electrode discs 237. Rods 310 are then removed. Note that the schematically represented accelerator plates 235 can be either a set of plates continuous across the entire electron optics assembly with apertures for each column, or a set of plates with one large aperture encompassing all columns, such that the optic axes for all columns pass through the aperture. Further note that the bolts 616 may be positioned peripherally, or between columns, and in both cases it is a requirement that they do not distort the uniform accelerating field.

FIG. 6b shows the alignment procedure for the lower part of the focus lens assembly; these assemblies are aligned separately before they are incorporated in the electron optics assembly. In FIG. 6b, second focus electrode 260, field-free tube 262, lower focus alignment pin 320, lower focus alignment pin insertion/removal direction 322, lower focus alignment direction 324 and focus lens insulator 605, are shown. The second focus electrode 260 is firmly attached to the focus lens insulator 605. The field-free tube 262 is movably attached to the focus lens insulator 605, allowing freedom of motion in the lower focus alignment direction 324 (the freedom of motion is beyond what is shown, being in all directions in the plane perpendicular to the plane of the figure). Lower focus alignment pin 320 is inserted into the focus lens assembly in the lower focus alignment pin insertion/removal direction 322. Alignment pin 320 has a sliding locational fit to the hole in the second focus electrode 260 and to the bore in the field-free tube 262, as shown, thus ensuring that these two holes are concentric. The field-free tube 262 is then firmly attached to the focus lens insulator 605 using screws or similar, and alignment pin 320 is removed.

FIG. 6c shows the procedure for merging and aligning the upper and lower parts of the focus lens assembly and alignment to the upper part of the electron optics assembly. In FIG. 6c, first accelerator electrode 226, alignment deflector 230, accelerator plates 235, final accelerator electrode 236, final accelerator electrode disc 237, focus electrode mounting plate 250, first focus electrode 255, second focus electrode 260, field-free tube 262, lower focus assembly 326, focus alignment pin 330, focus alignment pin insertion/removal direction 332, focus alignment direction 334 and focus lens insulator 605, are shown. Focus alignment pins 330 are first positioned over each final accelerator electrode disc 237 in the upper electron optics assembly. Alignment pins 330 are fabricated such that the counterbore which fits over the disc 237 has a sliding locational fit. This counterbore is machined to be accurately concentric to the outer pin diameter, which has a sliding locational fit to the first focus electrode 255. First focus electrodes 255 are loosely mounted to the focus electrode mounting plate 250, with freedom of motion in the focus alignment direction 334 (the freedom of motion is beyond what is shown, being in all directions in the plane perpendicular to the plane of the figure). Once each first focus electrode 255 is positioned on an alignment pin 330, it is firmly attached to the focus electrode mounting plate 250 using screws or similar. (Note that the apertures in the focus electrode mounting plate 250 are designed to be large enough to allow the proper alignment of the first focus electrodes 255 for all columns.) Next, the lower parts of the focus assembly (see FIG. 6b) are positioned over the lower ends of alignment pins 330. The hole in the second focus electrode 260 has a sliding locational fit to alignment pin 330, ensuring concentricity between the hole in the second focus electrode 260 and the hole in the first focus electrode 255. The lower part of the focus assembly is then firmly attached to the focus electrode mounting plate 250 (attachment shown in FIG. 6k), using screws or similar.

FIG. 6d shows a further detail of the procedure for merging and aligning the focus lens assembly to the upper part of the electron optics assembly. In FIG. 6d, first accelerator electrode 226, alignment deflector 230, accelerator plates 235, final accelerator electrode 236, final accelerator electrode disc 237, focus electrode mounting plate 250, first focus electrode 255, second focus electrode 260, field-free tube 262, focus alignment pin 330, securing collars 340, securing collar alignment directions 342, focus lens insulator 605, upper securing nuts 615, securing bolts 616 and lower securing nuts 617, are shown. A plurality of collars 340, one for each lower nut 617, were loosely attached to the focus electrode mounting plate 250 prior to merging with the upper part of the electron optics assembly. The collars 340 are free to move as shown by vectors 342 (the freedom of motion is beyond what is shown, being in all directions in the plane perpendicular to the plane of the figure). The collars 340 have a sliding locational fit over the outer diameter of the lower nuts 617. Once the collars 340 are properly located over the nuts 617, they are firmly attached to the focus electrode mounting plate 250 using screws or similar. The electron optics assembly, as shown in FIG. 6d, is now separated, allowing for removal of focus alignment pin 330 from each column (the upper part of the electron optics assembly can be lifted out of its seats in the collars 340, separating it from the focus lens assembly).

FIG. 6e shows the alignment procedure for the mainfield deflector and subfield deflector assemblies. In FIG. 6e, mainfield scanning deflector 240, subfield scanning deflector 245, focus electrode mounting plate 250, first focus electrode 255, second focus electrode 260, field-free tube 262, securing collars 340, scanning deflector alignment pin 350, scanning deflector alignment pin insertion/removal direction 352, scanning deflector alignment directions 354, and focus lens insulator 605 are shown. The deflectors 240 and 245 are loosely positioned to be roughly concentric with the hole in the first focus electrode 255, and have independent sideways freedom of motion, as shown by vectors 354 (the freedom of motion is beyond what is shown, being in all directions in the plane perpendicular to the plane of the figure). Alignment pins 350 are now inserted into each column as illustrated by vector 352. The mainfield deflector 240 and the subfield deflector 245 are now firmly attached to the focus electrode mounting plate 250 (attachment shown in FIG. 6k). Alignment pins 350 are then removed, as illustrated by vector 352.

FIG. 6f shows the attachment of a beam defining disc 238 followed by reassembly of the electron optics assembly. In FIG. 6f, first accelerator electrode 226, alignment deflector 230, accelerator plates 235, final accelerator electrode 236, final accelerator electrode disc 237, beam defining disc 238, mainfield scanning deflector 240, subfield scanning deflector 245, focus electrode mounting plate 250, first focus electrode 255, second focus electrode 260, field-free tube 262, securing collars 340, assembly/disassembly directions 344, focus lens insulator 605, upper securing nuts 615, securing bolts 616, and lower securing nuts 617, are shown. A beam-defining disc 238 is now attached to each shield electrode 237 in the column assembly. The beam-defining disc 238 is designed to attach concentrically to the hole in the electrode 237, ensuring the concentricity of the beam-defining disc 238 with the electron optical column axis. The beam-defining disc 238 is designed such that the aperture in the beam-defining disc 238 is concentric with the outer diameter of the beam-defining disc 238, thereby ensuring that the axis of beam 232 after it passes through the aperture in the beam-defining disc 238 is co-incident with the optical axis. The lower part of the electron optical column is then reattached to the upper part as illustrated by vectors 344.

FIG. 6g shows the addition of a detector assembly and its alignment procedure. In FIG. 6g, first accelerator electrode 226, alignment deflector 230, accelerator plates 235, final accelerator electrode 236, final accelerator electrode disc 237, beam defining disc 238, mainfield scanning deflector 240, subfield scanning deflector 245, focus electrode mounting plate 250, first focus electrode 255, second focus electrode 260, field-free tube 262, detector plate 265, electron detector 270, securing collars 340, detector alignment pin 360, detector alignment pin insertion/removal direction 362, detector alignment direction 364, focus lens insulator 605, upper securing nuts 615, securing bolts 616 and lower securing nuts 617, are shown. Detector plates 265, to which detectors 270 are already attached, are loosely attached, one per column, to the column assembly. The freedom of motion of the detector plates 265 is illustrated by vector 364 (the freedom of motion is beyond what is shown, being in all directions in the plane perpendicular to the plane of the figure). Alignment pins 360 are inserted into the hole of each detector plate 265 as illustrated by vector 362, with a sliding locational fit over the field-free tubes 262, and a sliding locational fit with the holes in the detector plates 265. Each alignment pin 360 is fabricated to ensure accurate concentricity between the outer diameter of pin 360 and the diameter of the counter bore, so that the hole in the detector plate 265 and the outer diameter of the field-free tube 262 are made to be concentric by this procedure. The field-free tubes 262 are fabricated to ensure accurate concentricity between their outer and inner diameters. The detector plate 265 is then firmly attached to the electron optics assembly (attachment shown in FIG. 6k) and the alignment pins 360 are removed from each column as illustrated by vector 362.

FIG. 6h shows the addition of and first step in the alignment procedure for a voltage contrast plate 275. In FIG. 6h, first accelerator electrode 226, alignment deflector 230, accelerator plates 235, final accelerator electrode 236, final accelerator electrode disc 237, beam defining disc 238, mainfield scanning deflector 240, subfield scanning deflector 245, focus electrode mounting plate 250, first focus electrode 255, second focus electrode 260, field-free tube 262, detector plate 265, electron detector 270, voltage contrast plate (VCP) 275, securing collars 340, VCP alignment pin 370, VCP alignment pin insertion/removal direction 372, VCP alignment direction 374, focus lens insulator 605, upper securing nuts 615, securing bolts 616 and lower securing nuts 617, are shown. A voltage contrast plate 275 is loosely attached to each column, with sideways freedom of motion illustrated by vector 374 (the freedom of motion is beyond what is shown, being in all directions in the plane perpendicular to the plane of the figure). Alignment pins 370 are inserted into each field-free tube 262 as shown by vector 372, with sliding locational fits to the holes in the field free tube 262 and in the voltage contrast plate 275. Each voltage contrast plate 275 is then firmly attached to the column assembly (attachment not shown) and the alignment pins 370 are removed, as illustrated by vector 372.

FIG. 6i shows an optional second step in the alignment procedure for a voltage contrast plate 275. This alignment step results in a controlled offset between the aperture in the voltage contrast plate 275 and the electron optic axis; this offset can provide improved secondary electron collection efficiencies and is described in U.S. patent application Ser. No. 10/126,943, incorporated by reference herein. In FIG. 6i, first accelerator electrode 226, alignment deflector 230, accelerator plates 235, final accelerator electrode 236, final accelerator electrode disc 237, beam defining disc 238, mainfield scanning deflector 240, subfield scanning deflector 245, focus electrode mounting plate 250, first focus electrode 255, second focus electrode 260, field-free tube 262, detector plate 265, electron detector 270, voltage contrast plate (VCP) 275, securing collars 340, VCP offset pin 380, VCP offset pin insertion/removal direction 382, VCP offset direction 384, focus lens insulator 605, upper securing nuts 615, securing bolts 616 and lower securing nuts 617, are shown. Alignment pins 380 are now inserted into each field-free tube 262, as illustrated by vector 382. The voltage contrast plate 275 is loosened, displaced sideways as illustrated by vector 384, then retightened—this enables a controlled positioning of the voltage contrast plate 275, as determined by twice the dimensional difference between the internal diameter of the field free tube 262 and the outer diameter of alignment pin 380.

FIG. 6j shows the addition of and alignment of an electron gun to the electron optics assembly. In FIG. 6j, suppressor electrode 200, electron emitter 205, extraction electrode 210, focus electrode 215, source alignment plate 221, electron gun 225, first accelerator electrode 226, gun mounting direction 390, source alignment plate outer diameter 392 and accelerator electrode counterbore inner diameter 394, are shown. Prior to the addition of the electron guns 225 to the electron optics assembly, each electron emitter 205 is independently aligned to the corresponding source alignment plate 221, using alignment procedures familiar to those skilled in the art. The outer diameter 392 of the source alignment plate 221 has a sliding locational fit to the inner diameter 394 of a counterbore on the first accelerator electrode 226. The counterbore on the first accelerator electrode 226 is machined to be concentric to the corresponding hole in the first accelerator electrode 226 which defines the column axis. The source is inserted into the first accelerator electrode 226 as shown by vector 390 and is secured using screws or similar, making the electron emitter 205 and the hole in the source alignment plate 221 concentric with the axis of the column. The electron gun 225 in a preferred embodiment is a Schottky electron gun; the fabrication, assembly and alignment of such an electron gun is well known to those skilled in the art.

In an alternative embodiment of the present invention, it is possible for each electron gun 225 to be independently-alignable with respect to the hole in the first accelerator electrode 226, which defines the column axis. Methods for implementing this alternative embodiment would be familiar to those skilled in the art. FIG. 6k shows an example of multiple columns within an electron optics assembly. The mechanical support structures for the different electron optical elements are shown. In FIG. 6k, electron guns 225, first accelerator electrode 226, alignment deflectors 230, accelerator plates 235, final accelerator electrode 236, final accelerator electrode discs 237, beam defining discs 238, mainfield scanning deflectors 240, subfield scanning deflectors 245, focus electrode mounting plate 250, first focus electrodes 255, second focus electrodes 260, field-free tubes 262, detector plates 265, electron detectors 270, voltage contrast plates 275, securing collars 340, focus lens insulators 605, upper securing nut 615, securing bolt 616, lower securing nut 617, alignment deflector supports 625, accelerator plate insulators 630, mainfield deflector supports 635, subfield deflector supports 636 and VCP supports 640, are shown. In the preferred embodiment, accelerator plates 235 are a set of plates with one large aperture encompassing all columns, such that the optic axes for all columns pass through the aperture, as shown in FIG. 6k. Only one bolt 616 is shown in FIG. 6k and this is positioned peripherally; multiple bolts 616 are required for the electron optics assembly and are preferably placed peripherally; although, the bolts 616 can be placed between columns providing they do not distort the uniform accelerating field. The alignment deflector supports 625, mainfield deflector supports 635, and subfield deflector supports 636 support the alignment deflectors 230, mainfield scanning deflectors 240 and subfield scanning deflectors 245 respectively. Alignment deflector supports 625 are shown secured to first accelerator electrode 226. Mainfield deflector supports 635 and subfield deflector supports 636 are shown secured to focus electrode mounting plate 250. These supports are shown secured at one point each; however, they can be secured at multiple points, should this be required for mechanical stability. Note that in preferred embodiments support structures such as alignment deflector supports 625, mainfield deflector supports 635, subfield deflector supports 636, focus lens insulators 605 and VCP supports 640 are one support structure per column in the assembly.

In the preferred embodiment, detector plates 265, focus lens insulators 605, securing bolts 616, alignment deflector supports 625, accelerator plate insulators 630, mainfield deflector supports 635, subfield deflector supports 636 and VCP supports 640 are made of ceramic or other electrically insulating material.

FIG. 6*l* shows an alternative embodiment of the present invention. The mechanical support structures for the different electron optical elements are shown. In FIG. 6*l*, electron guns 225, first accelerator electrode 226, alignment deflectors 230, accelerator plates 235, final accelerator electrode 236, final accelerator electrode discs 237, beam defining discs 238, mainfield scanning deflectors 240, subfield scanning deflectors 245, focus electrode mounting plate 250, first focus electrodes 255, second focus electrodes 260, field-free tubes 262, detector plates 265, electron detectors 270, voltage contrast plates 275, securing collars 340, focus lens insulators 605, upper securing nut 615, securing bolt 616, lower securing nut 617, alignment deflector support 625, accelerator plate insulators 630, mainfield deflector support 635, subfield deflector support 636 and VCP supports 640, are shown. Accelerator plates 235 are a set of plates with one large aperture encompassing all columns, such that the optic axes for all columns pass through the aperture, as shown in FIG. 6*l*. Only one bolt 616 is shown in FIG. 6*l* and this is positioned peripherally; multiple bolts 616 are required for the electron optics assembly and are preferably placed peripherally; although, the bolts 616 can be placed between columns providing they do not distort the uniform accelerating field. The alignment deflector support 625, mainfield deflector support 635, and subfield deflector support 636 support the alignment deflectors 230, mainfield scanning deflectors 240 and subfield scanning deflectors 245 respectively. Alignment deflector support 625 is shown secured to first accelerator electrode 226 at one end. Mainfield deflector support 635 and subfield deflector support 636 are shown secured to focus electrode mounting plate 250 at one end. These supports can be secured at multiple points, should this be required for mechanical stability. Note that in this alternative embodiment support structures such as alignment deflector support 625, mainfield deflector support 635, and subfield deflector support 636 are single support pieces for the entire assembly, whereas support structures such as focus lens insulators 605 and VCP supports 640 are one support structure per column in the assembly. Other embodiments may have support structures such as alignment deflector support 625, mainfield deflector support 635, and subfield deflector support 636 as multiple structures per assembly and even as one per column (as shown in FIG. 6*k*).

In this embodiment, detector plates 265, focus lens insulators 605, securing bolts 616, alignment deflector support 625, accelerator plate insulators 630, mainfield deflector support 635, subfield deflector support 636 and VCP supports 640 are made of ceramic or other electrically insulating material.

In further embodiments (not shown) the electron guns are attached to a single gun mounting plate. The gun mounting plate has gun mounting plate apertures, each aperture defining an electron beam column; each electron gun is mounted on the gun mounting plate at a corresponding plate aperture, such that there is a corresponding electron gun for each electron beam column in the electron optical assembly. In preferred embodiments, as shown in FIGS. 2, 6*k* and 6*l*, where the electron guns are mounted directly on top of the accelerating region, the first accelerating electrode is also functioning as the gun mounting plate. A separate gun mounting plate and first accelerator electrode are used when there is a separation between the electron guns and the accelerator region of the electron optics assembly.

The embodiments of the invention shown in FIGS. 6*a*–6*l* all have alignment procedures wherein the electron optical axes of the multiple columns are defined by the apertures in the first accelerator electrode 226, all other components are then aligned to these axes (on an individual column basis); the independent alignment on an individual column basis is achieved by having individual electron optical components per column, or by having individual alignment apertures per column (for example the focus electrode mounting plate 250 has independently alignable electrodes 255 attached for each column, allowing proper alignment of the first focus lens independently for each column). It will be clear to those skilled in the art that the alignment procedure can be modified so that the electron optical axes are defined by another element of the electron optics assembly, for example the final accelerator electrode 236 (in which case the final accelerator electrode disc 237 and beam defining disc 238 may be unnecessary), the focus electrode mounting plate 250 (in which case the first focus electrodes 255 may be unnecessary) or the gun mounting plate (should it be required).

While the invention has been described with reference to particular embodiments, this description is solely for the purpose of illustration and is not to be construed as limiting the scope of the invention claimed below. For example, in a further embodiment, fewer or more focusing lenses are used. Fewer focusing elements simplify the mechanical design, while more focusing elements improve spot size and depth of field. In another embodiment, the alignment deflectors are incorporated into each electron gun rather than as a separate component within the accelerating region.

What is claimed is:

1. An electron optics assembly for a multi-column electron beam inspection system comprising:
   a single focus electrode mounting plate, a multiplicity of mounting plate apertures extending through said mounting plate, such that there is a corresponding mounting plate aperture for each column; and
   a multiplicity of independently alignable focus electrodes coupled to said mounting plate, such that there is a corresponding independently alignable focus electrode for each column.

2. An electron optics assembly as in claim 1 further comprising a multiplicity of independently alignable scanning deflectors positioned above and coupled to said focus electrode mounting plate, such that there is a corresponding independently alignable scanning deflector for each column.

3. An electron optics assembly as in claim 1 further comprising a multiplicity of independently alignable second focus electrodes positioned below and coupled to said focus electrode mounting plate, such that there is a corresponding independently alignable second focus electrode for each column.

4. An electron optics assembly as in claim 1 further comprising a multiplicity of independently alignable electron detectors positioned below and coupled to said focus electrode mounting plate, such that there is a corresponding independently alignable electron detector for each column.

5. An electron optics assembly as in claim 4 further comprising a multiplicity of independently alignable field-free tubes, for shielding the electron beams from the electric fields associated with said electron detectors, said field-free tubes positioned below and coupled to said focus electrode mounting plate and positioned adjacent to said electron detectors, such that there is a corresponding independently alignable field-free tube for each column.

6. An electron optics assembly as in claim 1 further comprising a multiplicity of independently alignable voltage contrast plates positioned below and coupled to said focus electrode mounting plate, such that there is a corresponding independently alignable voltage contrast plate for each column.

7. An electron optics assembly as in claim 1 further comprising a multiplicity of separate electron guns positioned above said focus electrode mounting plate, such that there is a corresponding electron gun for each column.

8. An electron optics assembly as in claim 7 further comprising a single gun mounting plate positioned above said focus electrode mounting plate, a multiplicity of gun mounting plate apertures extending through said gun mounting plate, such that there is a corresponding gun mounting plate aperture for each column, said multiplicity of electron guns being positioned above and coupled to said gun mounting plate at corresponding gun mounting plate apertures, such that there is a corresponding electron gun for each column.

9. An electron optics assembly as in claim 8, wherein each of said electron guns is independently alignable.

10. An electron optics assembly as in claim 8, wherein each of said electron guns comprises a single Schottky electron emitter.

11. An electron optics assembly as in claim 8, further comprising a multiplicity of independently alignable alignment deflectors positioned below and coupled to said gun mounting plate, such that there is a corresponding independently alignable alignment deflector for each column.

12. An electron optics assembly as in claim 7 further comprising an accelerator structure positioned between said electron guns and said focus electrode mounting plate.

13. An electron optics assembly as in claim 12 wherein said accelerator structure comprises:

a first accelerator electrode positioned below said electron guns, a multiplicity of first electrode apertures extending through said first electrode, such that there is a corresponding first electrode aperture for each column;

a final accelerator electrode positioned above said focus electrode mounting plate, a multiplicity of final electrode apertures extending through said final electrode, such that there is a corresponding final electrode aperture for each column; and a set of accelerator plates positioned between said first and final accelerator electrodes, a single accelerator aperture extending through said accelerator plates, such that the optic axes for all columns pass through said accelerator aperture.

14. An electron optics assembly as in claim 13 wherein said first accelerator electrode is a gun mounting plate.

15. An electron optics assembly as in claim 13 further comprising a multiplicity of independently alignable beam defining discs coupled to said final accelerator plate, a multiplicity of beam defining apertures extending through said discs, such that there is a corresponding independently alignable beam defining aperture for each column.

16. An electron optics assembly as in claim 1 wherein the columns are arranged in an array.

17. An electron optics assembly as in claim 1 wherein the columns are arranged in a single row.

18. An accelerating structure for a multi-column electron beam inspection system comprising:

a first accelerator electrode, a multiplicity of first electrode apertures extending through said first electrode, such that there is a corresponding first electrode aperture for each column;

a final accelerator electrode, a multiplicity of final electrode apertures extending through said final electrode, such that there is a corresponding final electrode aperture for each column;

a set of accelerator plates positioned between said first and final accelerator electrodes, a single accelerator aperture extending through said accelerator plates, such that the optic axes for all columns pass through said aperture; and a multiplicity of independently alignable beam defining discs coupled to said final accelerator plate, such that there is a corresponding independently alignable beam defining disc for each column.

19. An accelerator structure as in claim 18 wherein said first accelerator electrode is a gun mounting plate.

* * * * *